(12) United States Patent
Jenkinson et al.

(10) Patent No.: US 11,417,383 B2
(45) Date of Patent: Aug. 16, 2022

(54) APPARATUSES AND METHODS FOR DYNAMIC REFRESH ALLOCATION

(71) Applicant: MICRON TECHNOLOGY, INC., Boise, ID (US)

(72) Inventors: Matthew D. Jenkinson, Boise, ID (US); Nathaniel J. Meier, Boise, ID (US); Dennis G. Montierth, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/186,913

(22) Filed: Feb. 26, 2021

(65) Prior Publication Data
US 2021/0183433 A1 Jun. 17, 2021

Related U.S. Application Data

(63) Continuation of application No. 16/549,411, filed on Aug. 23, 2019, now Pat. No. 11,302,374.

(51) Int. Cl.
| | | |
|---|---|---|
| *G11C 7/00* | (2006.01) | |
| *G11C 11/406* | (2006.01) | |
| *G11C 11/408* | (2006.01) | |

(52) U.S. Cl.
CPC .... *G11C 11/40603* (2013.01); *G11C 11/4087* (2013.01); *G11C 11/40611* (2013.01)

(58) Field of Classification Search
CPC ......... G11C 11/40603; G11C 11/40611; G11C 11/4087

(Continued)

(56) References Cited

U.S. PATENT DOCUMENTS

| | | |
|---|---|---|
| 5,299,159 A | 3/1994 | Balistreri et al. |
| 5,654,929 A | 8/1997 | Mote, Jr. |

(Continued)

FOREIGN PATENT DOCUMENTS

| | | |
|---|---|---|
| CN | 101038785 A | 9/2007 |
| CN | 101067972 A | 11/2007 |

(Continued)

OTHER PUBLICATIONS

U.S. Appl. No. 17/324,621 titled "Apparatuses and Methods for Pure-Time, Self-Adopt Sampling for Row Hammer Refresh Sampling" filed May 19, 2021.

(Continued)

*Primary Examiner* — Vu A Le
(74) *Attorney, Agent, or Firm* — Dorsey & Whitney LLP

(57) ABSTRACT

Embodiments of the disclosure are drawn to apparatuses, systems, and methods for dynamic refresh allocation. Memories may be subject to row hammer attacks, where one or more wordlines are repeatedly accessed to cause data degradation in victim rows nearby to the hammered wordlines. A memory may perform background auto-refresh operations, and targeted refresh operations where victim wordlines are refreshed. The memory may monitor access patterns to the memory in order to dynamically allocate the number of targeted refresh operations and auto-refresh operations in a set of refresh operations based on if a hammer attack is occurring and the type of hammer attack which is occurring.

20 Claims, 5 Drawing Sheets

(58) Field of Classification Search
USPC .................................................... 365/222
See application file for complete search history.

(56) References Cited

U.S. PATENT DOCUMENTS

| | | |
|---|---|---|
| 5,699,297 A | 12/1997 | Yamazaki et al. |
| 5,867,442 A | 2/1999 | Kim et al. |
| 5,933,377 A | 8/1999 | Hidaka |
| 5,943,283 A | 8/1999 | Wong et al. |
| 5,956,288 A | 9/1999 | Bermingham et al. |
| 5,959,923 A | 9/1999 | Matteson et al. |
| 5,970,507 A | 10/1999 | Kato et al. |
| 5,999,471 A | 12/1999 | Choi |
| 6,002,629 A | 12/1999 | Kim et al. |
| 6,011,734 A | 1/2000 | Pappert |
| 6,061,290 A | 5/2000 | Shirley |
| 6,064,621 A | 5/2000 | Tanizaki et al. |
| 6,212,118 B1 | 4/2001 | Fujita |
| 6,306,721 B1 | 10/2001 | Teo et al. |
| 6,310,806 B1 | 10/2001 | Higashi et al. |
| 6,310,814 B1 | 10/2001 | Hampel et al. |
| 6,363,024 B1 | 3/2002 | Fibranz |
| 6,392,952 B1 | 5/2002 | Chen et al. |
| 6,424,582 B1 | 7/2002 | Ooishi |
| 6,434,064 B2 | 8/2002 | Nagai |
| 6,452,868 B1 | 9/2002 | Fister |
| 6,515,928 B2 | 2/2003 | Sato et al. |
| 6,535,950 B1 | 3/2003 | Funyu et al. |
| 6,567,340 B1 | 5/2003 | Nataraj et al. |
| 6,950,364 B2 | 9/2005 | Kim |
| 7,002,868 B2 | 2/2006 | Takahashi |
| 7,057,960 B1 | 6/2006 | Fiscus et al. |
| 7,082,070 B2 | 7/2006 | Hong |
| 7,187,607 B2 | 3/2007 | Koshikawa et al. |
| 7,203,113 B2 | 4/2007 | Takahashi et al. |
| 7,203,115 B2 | 4/2007 | Eto et al. |
| 7,209,402 B2 | 4/2007 | Shinozaki et al. |
| 7,215,588 B2 | 5/2007 | Lee |
| 7,444,577 B2 | 10/2008 | Best et al. |
| 7,551,502 B2 | 6/2009 | Dono et al. |
| 7,565,479 B2 | 7/2009 | Best et al. |
| 7,692,993 B2 | 4/2010 | Iida et al. |
| 7,830,742 B2 | 11/2010 | Han |
| 8,174,921 B2 | 5/2012 | Kim et al. |
| 8,400,805 B2 | 3/2013 | Yoko |
| 8,572,423 B1 | 10/2013 | Isachar et al. |
| 8,625,360 B2 | 1/2014 | Iwamoto et al. |
| 8,681,578 B2 | 3/2014 | Narui |
| 8,756,368 B2 | 6/2014 | Best et al. |
| 8,811,100 B2 | 8/2014 | Ku |
| 8,862,973 B2 | 10/2014 | Zimmerman et al. |
| 8,938,573 B2 | 1/2015 | Greenfield et al. |
| 9,032,141 B2 | 5/2015 | Bains et al. |
| 9,047,978 B2 | 6/2015 | Bell et al. |
| 9,076,499 B2 | 7/2015 | Schoenborn |
| 9,087,602 B2 | 7/2015 | Youn et al. |
| 9,117,544 B2 | 8/2015 | Bains et al. |
| 9,123,447 B2 | 9/2015 | Lee et al. |
| 9,153,294 B2 | 10/2015 | Kang |
| 9,190,137 B2 | 11/2015 | Kim et al. |
| 9,190,139 B2 | 11/2015 | Jung et al. |
| 9,236,110 B2 | 1/2016 | Bains et al. |
| 9,251,885 B2 | 2/2016 | Greenfield et al. |
| 9,286,964 B2 | 3/2016 | Halbert et al. |
| 9,299,400 B2 | 3/2016 | Bains et al. |
| 9,311,984 B1 | 4/2016 | Hong et al. |
| 9,311,985 B2 | 4/2016 | Lee et al. |
| 9,324,398 B2 | 4/2016 | Jones et al. |
| 9,384,821 B2 | 7/2016 | Bains et al. |
| 9,390,782 B2 | 7/2016 | Best et al. |
| 9,396,786 B2 | 7/2016 | Yoon et al. |
| 9,406,358 B1 | 8/2016 | Lee |
| 9,412,432 B2 | 8/2016 | Narui et al. |
| 9,418,723 B2 | 8/2016 | Chishti et al. |
| 9,424,907 B2 | 8/2016 | Fujishiro |
| 9,484,079 B2 | 11/2016 | Lee |
| 9,514,850 B2 | 12/2016 | Kim |
| 9,570,143 B2 | 2/2017 | Lim et al. |
| 9,570,201 B2 | 2/2017 | Morgan et al. |
| 9,646,672 B1 | 5/2017 | Kim et al. |
| 9,653,139 B1 | 5/2017 | Park |
| 9,672,889 B2 | 6/2017 | Lee et al. |
| 9,685,240 B1 | 6/2017 | Park |
| 9,691,466 B1 | 6/2017 | Kim |
| 9,697,913 B1 | 7/2017 | Mariani et al. |
| 9,734,887 B1 | 8/2017 | Tavva |
| 9,741,409 B2 | 8/2017 | Jones et al. |
| 9,741,447 B2 | 8/2017 | Akamatsu |
| 9,747,971 B2 | 8/2017 | Bains et al. |
| 9,761,297 B1 | 9/2017 | Tomishima |
| 9,786,351 B2 | 10/2017 | Lee et al. |
| 9,799,391 B1 | 10/2017 | Wei |
| 9,805,782 B1 | 10/2017 | Liou |
| 9,805,783 B2 | 10/2017 | Ito et al. |
| 9,812,185 B2 | 11/2017 | Fisch et al. |
| 9,818,469 B1 | 11/2017 | Kim et al. |
| 9,831,003 B2 | 11/2017 | Sohn et al. |
| 9,865,326 B2 | 1/2018 | Bains et al. |
| 9,865,328 B1 | 1/2018 | Desimone et al. |
| 9,922,694 B2 | 3/2018 | Akamatsu |
| 9,934,143 B2 | 4/2018 | Bains et al. |
| 9,953,696 B2 | 4/2018 | Kim |
| 9,978,430 B2 | 5/2018 | Seo et al. |
| 10,020,045 B2 | 7/2018 | Riho |
| 10,020,046 B1 | 7/2018 | Uemura |
| 10,032,501 B2 * | 7/2018 | Ito .................. G11C 11/406 |
| 10,049,716 B2 | 8/2018 | Proebsting |
| 10,083,737 B2 | 9/2018 | Bains et al. |
| 10,090,038 B2 | 10/2018 | Shin |
| 10,134,461 B2 | 11/2018 | Bell et al. |
| 10,141,042 B1 | 11/2018 | Richter |
| 10,147,472 B2 | 12/2018 | Jones et al. |
| 10,153,031 B2 | 12/2018 | Akamatsu |
| 10,170,174 B1 | 1/2019 | Ito et al. |
| 10,192,608 B2 | 1/2019 | Morgan |
| 10,210,925 B2 | 2/2019 | Bains et al. |
| 10,297,305 B1 | 5/2019 | Moon et al. |
| 10,297,307 B1 | 5/2019 | Raad et al. |
| 10,339,994 B2 | 7/2019 | Ito et al. |
| 10,381,327 B2 | 8/2019 | Ramachandra et al. |
| 10,446,256 B2 | 10/2019 | Ong et al. |
| 10,468,076 B1 | 11/2019 | He et al. |
| 10,490,250 B1 | 11/2019 | Ito et al. |
| 10,490,251 B2 | 11/2019 | Wolff |
| 10,504,577 B1 | 12/2019 | Alzheimer |
| 10,510,396 B1 | 12/2019 | Notani et al. |
| 10,572,377 B1 | 2/2020 | Zhang et al. |
| 10,573,370 B2 | 2/2020 | Ito et al. |
| 10,607,679 B2 | 3/2020 | Nakaoka |
| 10,685,696 B2 | 6/2020 | Brown et al. |
| 10,699,796 B2 | 6/2020 | Benedict et al. |
| 10,790,005 B1 | 9/2020 | He et al. |
| 10,825,505 B2 | 11/2020 | Rehmeyer |
| 10,832,792 B1 | 11/2020 | Penney et al. |
| 10,930,335 B2 | 2/2021 | Bell et al. |
| 10,943,636 B1 | 3/2021 | Wu et al. |
| 10,950,289 B2 | 3/2021 | Ito et al. |
| 10,957,377 B2 | 3/2021 | Noguchi |
| 10,964,378 B2 | 3/2021 | Ayyapureddi et al. |
| 10,978,132 B2 | 4/2021 | Rehmeyer et al. |
| 11,017,833 B2 | 5/2021 | Wu et al. |
| 11,069,393 B2 | 7/2021 | Cowles et al. |
| 11,081,160 B2 | 8/2021 | Ito et al. |
| 11,222,683 B2 | 1/2022 | Rehmeyer |
| 11,222,686 B1 | 1/2022 | Noguchi |
| 11,227,649 B2 | 1/2022 | Meier et al. |
| 11,264,079 B1 | 3/2022 | Roberts |
| 2001/0008498 A1 | 7/2001 | Ooishi |
| 2002/0026613 A1 | 2/2002 | Niiro |
| 2002/0181301 A1 | 12/2002 | Takahashi et al. |
| 2002/0191467 A1 | 12/2002 | Matsumoto et al. |
| 2003/0026161 A1 | 2/2003 | Yamaguchi et al. |
| 2003/0063512 A1 | 4/2003 | Takahashi et al. |
| 2003/0067825 A1 | 4/2003 | Shimano et al. |

(56) References Cited

U.S. PATENT DOCUMENTS

| | | |
|---|---|---|
| 2003/0081483 A1 | 5/2003 | De Paor et al. |
| 2003/0123301 A1 | 7/2003 | Jang et al. |
| 2003/0161208 A1 | 8/2003 | Nakashima et al. |
| 2003/0193829 A1 | 10/2003 | Morgan et al. |
| 2003/0231540 A1 | 12/2003 | Lazar et al. |
| 2004/0004856 A1 | 1/2004 | Sakimura et al. |
| 2004/0008544 A1 | 1/2004 | Shinozaki et al. |
| 2004/0022093 A1 | 2/2004 | Lee |
| 2004/0024955 A1 | 2/2004 | Patel |
| 2004/0114446 A1 | 6/2004 | Takahashi et al. |
| 2004/0130959 A1 | 7/2004 | Kawaguchi et al. |
| 2004/0184323 A1 | 9/2004 | Mori et al. |
| 2004/0218431 A1 | 11/2004 | Chung et al. |
| 2005/0002268 A1 | 1/2005 | Otsuka et al. |
| 2005/0041502 A1 | 2/2005 | Perner |
| 2005/0105362 A1 | 5/2005 | Choi et al. |
| 2005/0108460 A1 | 5/2005 | David |
| 2005/0213408 A1 | 9/2005 | Shieh et al. |
| 2005/0243627 A1 | 11/2005 | Lee et al. |
| 2005/0265104 A1 | 12/2005 | Remaklus et al. |
| 2006/0018174 A1 | 1/2006 | Park et al. |
| 2006/0083099 A1 | 4/2006 | Bae et al. |
| 2006/0087903 A1 | 4/2006 | Riho et al. |
| 2006/0104139 A1 | 5/2006 | Hur et al. |
| 2006/0176744 A1 | 8/2006 | Stave |
| 2006/0215474 A1 | 9/2006 | Hokenmaier |
| 2006/0233012 A1 | 10/2006 | Sekiguchi et al. |
| 2006/0262616 A1 | 11/2006 | Chen |
| 2006/0262617 A1 | 11/2006 | Lee |
| 2006/0268643 A1 | 11/2006 | Schreck et al. |
| 2007/0002651 A1 | 1/2007 | Lee |
| 2007/0008799 A1 | 1/2007 | Dono et al. |
| 2007/0014175 A1 | 1/2007 | Min et al. |
| 2007/0028068 A1 | 2/2007 | Golding et al. |
| 2007/0030746 A1 | 2/2007 | Best et al. |
| 2007/0033339 A1 | 2/2007 | Best et al. |
| 2007/0147154 A1 | 6/2007 | Lee |
| 2007/0237016 A1 | 10/2007 | Miyamoto et al. |
| 2007/0263442 A1 | 11/2007 | Cornwell et al. |
| 2007/0297252 A1 | 12/2007 | Singh |
| 2008/0028260 A1 | 1/2008 | Oyagi et al. |
| 2008/0031068 A1 | 2/2008 | Yoe et al. |
| 2008/0126893 A1 | 5/2008 | Harrand et al. |
| 2008/0130394 A1 | 6/2008 | Dono et al. |
| 2008/0181048 A1 | 7/2008 | Han |
| 2008/0212386 A1 | 9/2008 | Riho |
| 2008/0224742 A1 | 9/2008 | Pomichter |
| 2008/0253212 A1 | 10/2008 | Iida et al. |
| 2008/0253213 A1 | 10/2008 | Sato et al. |
| 2008/0266990 A1 | 10/2008 | Loeffler |
| 2008/0270683 A1 | 10/2008 | Barth et al. |
| 2008/0306723 A1 | 12/2008 | De Ambroggi et al. |
| 2008/0316845 A1 | 12/2008 | Wang et al. |
| 2009/0021999 A1 | 1/2009 | Tanimura et al. |
| 2009/0052264 A1 | 2/2009 | Hong et al. |
| 2009/0059641 A1 | 3/2009 | Jeddeloh |
| 2009/0073760 A1 | 3/2009 | Betser et al. |
| 2009/0161468 A1 | 6/2009 | Fujioka |
| 2009/0168571 A1 | 7/2009 | Pyo et al. |
| 2009/0185440 A1 | 7/2009 | Lee |
| 2009/0201752 A1 | 8/2009 | Riho et al. |
| 2009/0228739 A1 | 9/2009 | Cohen et al. |
| 2009/0251971 A1 | 10/2009 | Futatsuyama |
| 2009/0296510 A1 | 12/2009 | Lee et al. |
| 2010/0005217 A1 | 1/2010 | Jeddeloh |
| 2010/0005376 A1 | 1/2010 | Laberge et al. |
| 2010/0061153 A1 | 3/2010 | Yen et al. |
| 2010/0074042 A1 | 3/2010 | Fukuda et al. |
| 2010/0097870 A1 | 4/2010 | Kim et al. |
| 2010/0110809 A1 | 5/2010 | Kobayashi et al. |
| 2010/0110810 A1 | 5/2010 | Kobayashi |
| 2010/0124138 A1 | 5/2010 | Lee et al. |
| 2010/0128547 A1 | 5/2010 | Kagami |
| 2010/0131812 A1 | 5/2010 | Mohammad |
| 2010/0141309 A1 | 6/2010 | Lee |
| 2010/0157693 A1 | 6/2010 | Iwai et al. |
| 2010/0182862 A1 | 7/2010 | Teramoto |
| 2010/0182863 A1 | 7/2010 | Fukiage |
| 2010/0329069 A1 | 12/2010 | Ito et al. |
| 2011/0026290 A1 | 2/2011 | Noda et al. |
| 2011/0055495 A1 | 3/2011 | Remaklus et al. |
| 2011/0069572 A1 | 3/2011 | Lee et al. |
| 2011/0122987 A1 | 5/2011 | Neyer |
| 2011/0134715 A1 | 6/2011 | Norman |
| 2011/0216614 A1 | 9/2011 | Hosoe |
| 2011/0225355 A1 | 9/2011 | Kajigaya |
| 2011/0299352 A1 | 12/2011 | Fujishiro et al. |
| 2011/0310648 A1 | 12/2011 | Iwamoto et al. |
| 2012/0014199 A1 | 1/2012 | Narui |
| 2012/0059984 A1 | 3/2012 | Kang et al. |
| 2012/0151131 A1 | 6/2012 | Kilmer et al. |
| 2012/0155173 A1 | 6/2012 | Lee et al. |
| 2012/0155206 A1 | 6/2012 | Kodama et al. |
| 2012/0213021 A1 | 8/2012 | Riho et al. |
| 2012/0254472 A1 | 10/2012 | Ware et al. |
| 2012/0287727 A1 | 11/2012 | Wang |
| 2012/0307582 A1 | 12/2012 | Marumoto et al. |
| 2012/0327734 A1 | 12/2012 | Sata |
| 2013/0003467 A1 | 1/2013 | Klein |
| 2013/0003477 A1 | 1/2013 | Park et al. |
| 2013/0028034 A1 | 1/2013 | Fujisawa |
| 2013/0051157 A1 | 2/2013 | Park |
| 2013/0051171 A1 | 2/2013 | Porter et al. |
| 2013/0077423 A1 | 3/2013 | Lee |
| 2013/0173971 A1 | 7/2013 | Zimmerman |
| 2013/0254475 A1 | 9/2013 | Perego |
| 2013/0279284 A1 | 10/2013 | Jeong |
| 2014/0006700 A1 | 1/2014 | Schaefer et al. |
| 2014/0006703 A1 | 1/2014 | Bains et al. |
| 2014/0006704 A1 | 1/2014 | Greenfield et al. |
| 2014/0013169 A1 | 1/2014 | Kobla et al. |
| 2014/0013185 A1 | 1/2014 | Kobla et al. |
| 2014/0016422 A1 | 1/2014 | Kim et al. |
| 2014/0022858 A1 | 1/2014 | Chen et al. |
| 2014/0043888 A1 | 2/2014 | Chen et al. |
| 2014/0050004 A1 | 2/2014 | Mochida |
| 2014/0078841 A1 | 3/2014 | Chopra |
| 2014/0078842 A1 | 3/2014 | Oh et al. |
| 2014/0089576 A1 | 3/2014 | Bains et al. |
| 2014/0089758 A1 | 3/2014 | Kwok et al. |
| 2014/0095780 A1 | 4/2014 | Bains et al. |
| 2014/0095786 A1 | 4/2014 | Moon et al. |
| 2014/0119091 A1 | 5/2014 | You et al. |
| 2014/0143473 A1 | 5/2014 | Kim et al. |
| 2014/0169114 A1 | 6/2014 | Oh |
| 2014/0177370 A1 | 6/2014 | Halbert et al. |
| 2014/0181453 A1 | 6/2014 | Jayasena et al. |
| 2014/0185403 A1 | 7/2014 | Lai |
| 2014/0189228 A1 | 7/2014 | Greenfield et al. |
| 2014/0219042 A1 | 8/2014 | Yu et al. |
| 2014/0219043 A1 | 8/2014 | Jones et al. |
| 2014/0237307 A1 | 8/2014 | Kobla et al. |
| 2014/0241099 A1 | 8/2014 | Seo et al. |
| 2014/0254298 A1 | 9/2014 | Dally |
| 2014/0281206 A1 | 9/2014 | Crawford et al. |
| 2014/0281207 A1 | 9/2014 | Mandava et al. |
| 2014/0293725 A1 | 10/2014 | Best et al. |
| 2014/0321226 A1 | 10/2014 | Pyeon |
| 2015/0016203 A1 | 1/2015 | Sriramagiri et al. |
| 2015/0049566 A1 | 2/2015 | Lee et al. |
| 2015/0049567 A1 | 2/2015 | Chi |
| 2015/0055420 A1 | 2/2015 | Bell et al. |
| 2015/0078112 A1 | 3/2015 | Huang |
| 2015/0085564 A1 | 3/2015 | Yoon et al. |
| 2015/0089326 A1 | 3/2015 | Joo et al. |
| 2015/0092508 A1 | 4/2015 | Bains |
| 2015/0109871 A1 | 4/2015 | Bains et al. |
| 2015/0120999 A1 | 4/2015 | Kim et al. |
| 2015/0134897 A1 | 5/2015 | Sriramagiri et al. |
| 2015/0155025 A1 | 6/2015 | Lee et al. |
| 2015/0162064 A1 | 6/2015 | Oh et al. |
| 2015/0162067 A1 | 6/2015 | Kim et al. |
| 2015/0170728 A1 | 6/2015 | Jung et al. |
| 2015/0199126 A1 | 7/2015 | Jayasena et al. |

(56) References Cited

U.S. PATENT DOCUMENTS

| | | |
|---|---|---|
| 2015/0206572 A1 | 7/2015 | Lim et al. |
| 2015/0213872 A1 | 7/2015 | Mazumder et al. |
| 2015/0243339 A1 | 8/2015 | Bell et al. |
| 2015/0255140 A1 | 9/2015 | Song |
| 2015/0279442 A1 | 10/2015 | Hwang |
| 2015/0294711 A1 | 10/2015 | Gaither et al. |
| 2015/0340077 A1 | 11/2015 | Akamatsu |
| 2015/0356048 A1 | 12/2015 | King |
| 2015/0380073 A1 | 12/2015 | Joo et al. |
| 2016/0019940 A1 | 1/2016 | Jang et al. |
| 2016/0027498 A1 | 1/2016 | Ware et al. |
| 2016/0027531 A1 | 1/2016 | Jones et al. |
| 2016/0027532 A1 | 1/2016 | Kim |
| 2016/0042782 A1 | 2/2016 | Narui et al. |
| 2016/0070483 A1 | 3/2016 | Yoon et al. |
| 2016/0078846 A1 | 3/2016 | Liu et al. |
| 2016/0078911 A1 | 3/2016 | Fujiwara et al. |
| 2016/0086649 A1 | 3/2016 | Hong et al. |
| 2016/0093402 A1 | 3/2016 | Kitagawa et al. |
| 2016/0125931 A1 | 5/2016 | Doo et al. |
| 2016/0133314 A1 | 5/2016 | Hwang et al. |
| 2016/0155491 A1 | 6/2016 | Roberts et al. |
| 2016/0180917 A1 | 6/2016 | Chishti et al. |
| 2016/0180921 A1 | 6/2016 | Jeong |
| 2016/0196863 A1 | 7/2016 | Shin et al. |
| 2016/0202926 A1 | 7/2016 | Benedict |
| 2016/0225433 A1 | 8/2016 | Bains et al. |
| 2016/0336060 A1 | 11/2016 | Shin |
| 2016/0343423 A1 | 11/2016 | Shido |
| 2017/0011792 A1 | 1/2017 | Oh et al. |
| 2017/0052722 A1 | 2/2017 | Ware et al. |
| 2017/0076779 A1 | 3/2017 | Bains et al. |
| 2017/0092350 A1 | 3/2017 | Halbert et al. |
| 2017/0111792 A1 | 4/2017 | Correia Fernandes et al. |
| 2017/0133085 A1 | 5/2017 | Kim et al. |
| 2017/0133108 A1 | 5/2017 | Lee et al. |
| 2017/0140807 A1 | 5/2017 | Sun et al. |
| 2017/0140810 A1 | 5/2017 | Choi et al. |
| 2017/0140811 A1 | 5/2017 | Joo |
| 2017/0146598 A1 | 5/2017 | Kim et al. |
| 2017/0148504 A1 | 5/2017 | Saifuddin et al. |
| 2017/0177246 A1 | 6/2017 | Miller et al. |
| 2017/0186481 A1 | 6/2017 | Oh et al. |
| 2017/0213586 A1 | 7/2017 | Kang et al. |
| 2017/0221546 A1 | 8/2017 | Loh et al. |
| 2017/0263305 A1 | 9/2017 | Cho |
| 2017/0269861 A1 | 9/2017 | Lu et al. |
| 2017/0287547 A1 | 10/2017 | Ito et al. |
| 2017/0323675 A1 | 11/2017 | Jones et al. |
| 2017/0345482 A1 | 11/2017 | Balakrishnan |
| 2017/0352404 A1 | 12/2017 | Lee et al. |
| 2018/0005690 A1 | 1/2018 | Morgan et al. |
| 2018/0025770 A1 | 1/2018 | Ito et al. |
| 2018/0025772 A1 | 1/2018 | Lee et al. |
| 2018/0025773 A1 | 1/2018 | Bains et al. |
| 2018/0033479 A1 | 2/2018 | Lea et al. |
| 2018/0047110 A1 | 2/2018 | Blackman et al. |
| 2018/0061476 A1 | 3/2018 | Kim |
| 2018/0061483 A1 | 3/2018 | Morgan |
| 2018/0061485 A1 | 3/2018 | Joo |
| 2018/0075927 A1 | 3/2018 | Jeong et al. |
| 2018/0082737 A1 | 3/2018 | Lee |
| 2018/0096719 A1 | 4/2018 | Tomishima et al. |
| 2018/0102776 A1 | 4/2018 | Chandrasekar et al. |
| 2018/0107417 A1 | 4/2018 | Shechter et al. |
| 2018/0108401 A1 | 4/2018 | Choi et al. |
| 2018/0114561 A1 | 4/2018 | Fisch et al. |
| 2018/0114565 A1 | 4/2018 | Lee |
| 2018/0122454 A1 | 5/2018 | Lee et al. |
| 2018/0130506 A1 | 5/2018 | Kang et al. |
| 2018/0137005 A1 | 5/2018 | Wu et al. |
| 2018/0158504 A1 | 6/2018 | Akamatsu |
| 2018/0158507 A1 | 6/2018 | Bang |
| 2018/0182445 A1 | 6/2018 | Lee et al. |
| 2018/0190340 A1 | 7/2018 | Kim et al. |
| 2018/0218767 A1 | 8/2018 | Wolff |
| 2018/0226119 A1 | 8/2018 | Kim et al. |
| 2018/0233197 A1 | 8/2018 | Laurent |
| 2018/0240511 A1 | 8/2018 | Yoshida et al. |
| 2018/0247876 A1 | 8/2018 | Kim et al. |
| 2018/0254078 A1 | 9/2018 | We et al. |
| 2018/0261268 A1 | 9/2018 | Hyun et al. |
| 2018/0276150 A1 | 9/2018 | Eckert et al. |
| 2018/0285007 A1 | 10/2018 | Franklin et al. |
| 2018/0294028 A1 | 10/2018 | Lee et al. |
| 2018/0308539 A1 | 10/2018 | Ito et al. |
| 2018/0341553 A1 | 11/2018 | Koudele et al. |
| 2019/0013059 A1 | 1/2019 | Akamatsu |
| 2019/0043558 A1 | 2/2019 | Suh et al. |
| 2019/0051344 A1 | 2/2019 | Bell et al. |
| 2019/0065087 A1 | 2/2019 | Li et al. |
| 2019/0066759 A1 | 2/2019 | Nale |
| 2019/0066766 A1 | 2/2019 | Lee |
| 2019/0088315 A1 | 3/2019 | Saenz et al. |
| 2019/0088316 A1 | 3/2019 | Inuzuka et al. |
| 2019/0103147 A1 | 4/2019 | Jones et al. |
| 2019/0115069 A1 | 4/2019 | Lai |
| 2019/0122723 A1 | 4/2019 | Ito et al. |
| 2019/0129651 A1 | 5/2019 | Wuu et al. |
| 2019/0130960 A1 | 5/2019 | Kim |
| 2019/0130961 A1 | 5/2019 | Bell et al. |
| 2019/0147964 A1 | 5/2019 | Yun et al. |
| 2019/0161341 A1 | 5/2019 | Howe |
| 2019/0190341 A1 | 6/2019 | Beisele et al. |
| 2019/0196730 A1 | 6/2019 | Imran |
| 2019/0198078 A1 | 6/2019 | Hoang et al. |
| 2019/0198099 A1 | 6/2019 | Mirichigni et al. |
| 2019/0205253 A1 | 7/2019 | Roberts |
| 2019/0228810 A1 | 7/2019 | Jones et al. |
| 2019/0228815 A1 | 7/2019 | Morohashi et al. |
| 2019/0252020 A1 | 8/2019 | Rios et al. |
| 2019/0267077 A1 | 8/2019 | Ito et al. |
| 2019/0279706 A1 | 9/2019 | Kim |
| 2019/0294348 A1 | 9/2019 | Ware et al. |
| 2019/0333573 A1 | 10/2019 | Shin et al. |
| 2019/0347019 A1 | 11/2019 | Shin et al. |
| 2019/0348100 A1 | 11/2019 | Smith et al. |
| 2019/0348102 A1 | 11/2019 | Smith et al. |
| 2019/0348103 A1 | 11/2019 | Jeong et al. |
| 2019/0362774 A1 | 11/2019 | Kuramori et al. |
| 2019/0385661 A1 | 12/2019 | Koo et al. |
| 2019/0385667 A1 | 12/2019 | Morohashi et al. |
| 2019/0385668 A1 | 12/2019 | Fujioka et al. |
| 2019/0385670 A1 | 12/2019 | Notani et al. |
| 2019/0386557 A1 | 12/2019 | Wang et al. |
| 2019/0391760 A1 | 12/2019 | Miura et al. |
| 2019/0392886 A1 | 12/2019 | Cox et al. |
| 2020/0005857 A1 | 1/2020 | Ito et al. |
| 2020/0051616 A1 | 2/2020 | Cho |
| 2020/0075086 A1 | 3/2020 | Hou et al. |
| 2020/0082873 A1 | 3/2020 | Wolff |
| 2020/0126611 A1 | 4/2020 | Riho et al. |
| 2020/0135263 A1 | 4/2020 | Brown et al. |
| 2020/0143871 A1 | 5/2020 | Kim et al. |
| 2020/0176050 A1 | 6/2020 | Ito et al. |
| 2020/0185026 A1 | 6/2020 | Yun et al. |
| 2020/0194056 A1 | 6/2020 | Sakurai et al. |
| 2020/0202921 A1 | 6/2020 | Morohashi et al. |
| 2020/0210278 A1 | 7/2020 | Rooney et al. |
| 2020/0211632 A1 | 7/2020 | Noguchi |
| 2020/0211633 A1 | 7/2020 | Okuma |
| 2020/0211634 A1 | 7/2020 | Ishikawa et al. |
| 2020/0219555 A1 | 7/2020 | Rehmeyer |
| 2020/0219556 A1 | 7/2020 | Ishikawa et al. |
| 2020/0265888 A1 | 8/2020 | Ito et al. |
| 2020/0273517 A1 | 8/2020 | Yamamoto |
| 2020/0273518 A1 | 8/2020 | Raad et al. |
| 2020/0279599 A1 | 9/2020 | Ware et al. |
| 2020/0294569 A1 | 9/2020 | Wu et al. |
| 2020/0294576 A1 | 9/2020 | Brown et al. |
| 2020/0321049 A1 | 10/2020 | Meier et al. |
| 2020/0381040 A1 | 12/2020 | Penney et al. |
| 2020/0388324 A1 | 12/2020 | Rehmeyer et al. |
| 2020/0388325 A1 | 12/2020 | Cowles et al. |

(56) References Cited

U.S. PATENT DOCUMENTS

| | | | |
|---|---|---|---|
| 2020/0395063 | A1 | 12/2020 | Rehmeyer |
| 2021/0057021 | A1 | 2/2021 | Wu et al. |
| 2021/0057022 | A1 | 2/2021 | Jenkinson et al. |
| 2021/0118491 | A1 | 4/2021 | Li et al. |
| 2021/0166752 | A1 | 6/2021 | Noguchi |
| 2021/0183435 | A1 | 6/2021 | Meier et al. |
| 2021/0225431 | A1 | 7/2021 | Rehmeyer et al. |
| 2021/0304813 | A1 | 9/2021 | Cowles et al. |
| 2021/0335411 | A1 | 10/2021 | Wu et al. |
| 2022/0059153 | A1 | 2/2022 | Zhang et al. |
| 2022/0059158 | A1 | 2/2022 | Wu et al. |

FOREIGN PATENT DOCUMENTS

| | | | |
|---|---|---|---|
| CN | 104350546 | A | 2/2015 |
| CN | 106710621 | A | 5/2017 |
| CN | 107871516 | A | 4/2018 |
| JP | 2005-216429 | A | 8/2005 |
| JP | 2011-258259 | A | 12/2011 |
| JP | 4911510 | B2 | 1/2012 |
| JP | 2013-004158 | A | 1/2013 |
| JP | 6281030 | B1 | 1/2018 |
| WO | 2014120477 | | 8/2014 |
| WO | 2015030991 | A1 | 3/2015 |
| WO | 2017171927 | A1 | 10/2017 |
| WO | 2019222960 | A1 | 11/2019 |
| WO | 2020010010 | A1 | 1/2020 |
| WO | 2020117686 | A1 | 6/2020 |
| WO | 2020247163 | A1 | 12/2020 |
| WO | 2020247639 | A1 | 12/2020 |

OTHER PUBLICATIONS

U.S. Appl. No. 17/347,957 titled "Apparatuses and Methods for Controlling Steal Rates" filed Jun. 15, 2021.
U.S. Appl. No. 16/432,604 titled "Apparatuses and Methods for Staggered Timing of Skipped Refresh Operations" filed Jun. 5, 2019, pp. all.
U.S. Appl. No. 17/226,975, titled "Apparatuses and Methods for Staggered Timing of Skipped Refresh Operations" filed Apr. 9, 2021, pp. all.
Application No. PCT/US20/23689, titled "Semiconductor Device Having Cam That Stores Address Signals", dated Mar. 19, 2020.
U.S. Appl. No. 16/797,658, titles "Apparatuses and Methods for Controlling Refresh Operations", filed Feb. 21, 2020.
U.S. Appl. No. 16/805,197, titled "Apparatuses and Methods for Calculating Row Hammer Refresh Addresses in a Semiconductor Device", dated Feb. 28, 2020.
U.S. Appl. No. 16/268,818, titled "Apparatuses and Methods for Managing Row Access Counts", filed Feb. 6, 2019.
U.S. Appl. No. 16/358,587, titled "Semiconductor Device Having Cam That Stores Address Signals", dated Mar. 19, 2019.
U.S. Appl. No. 16/411,573 titled "Apparatuses, Systems, and Methods for a Content Addressable Memory Cell" filed May 14, 2019.
U.S. Appl. No. 16/428,625 titled "Apparatuses and Methods for Tracking Victim Rows" filed May 31, 2019.
U.S. Appl. No. 16/513,400 titled "Apparatuses and Methods for Tracking Row Accesses" filed Jul. 16, 2019.
U.S. Appl. No. 16/548,027 titled "Apparatuses, Systems, and Methods for Analog Row Access Rate Determination" filed Aug. 22, 2019.
U.S. Appl. No. 16/549,942 titled "Apparatuses and Methods for Lossy Row Access Counting" filed Aug. 23, 2019.
U.S. Appl. No. 16/546,152 titled "Apparatuses and Methods for Analog Row Access Tracking" filed Aug. 20, 2019.
U.S. Appl. No. 15/881,256 entitled 'Apparatuses and Methods for Detecting a Row Hammer Attack With a Bandpass Filter' filed Jan. 26, 2018.
U.S. Appl. No. 16/425,525 titled "Apparatuses and Methods for Tracking All Row Accesses" filed May 29, 2019.

U.S. Appl. No. 16/427,105 titled "Apparatuses and Methods for Priority Targeted Refresh Operations" filed May 30, 2019.
U.S. Appl. No. 16/427,140 titled "Apparatuses and Methods for Tracking Row Access Counts Between Multiple Register Stacks" filed May 30, 2019.
U.S. Appl. No. 16/437,811 titled "Apparatuses, Systems, and Methods for Determining Extremum Numerical Values" filed Jun. 11, 2019.
U.S. Appl. No. 17/187,002 titled "Apparatuses and Methods for Staggered Timing of Targeted Refresh Operations" filed Feb. 26, 2021.
U.S. Appl. No. 15/789,897, entitled "Apparatus and Methods for Refreshing Memory", filed Oct. 20, 2017.
U.S. Appl. No. 15/796,340, entitled: "Apparatus and Methods for Refreshing Memory" filed Oct. 27, 2017.
U.S. Appl. No. 16/012,679, titled "Apparatus and Methods for Multiple Row Hammer Refresh Address Sequences", filed Jun. 19, 2018.
U.S. Appl. No. 16/020,863, titled "Semiconductor Device", filed Jun. 27, 2018.
U.S. Appl. No. 16/112,471 titled "Apparatuses and Methods for Controlling Refresh Operations" filed Aug. 24, 2018.
U.S. Appl. No. 16/160,801, titled "Apparatuses and Methods for Selective Row Refreshes" filed Oct. 15, 2018.
U.S. Appl. No. 16/231,327 titled "Apparatuses and Methods for Selective Row Refreshes", filed Dec. 21, 2018.
U.S. Appl. No. 16/237,291, titled "Apparatus and Methods for Refreshing Memory", filed Dec. 31, 2018.
U.S. Appl. No. 16/411,698 title "Semiconductor Device" filed May 14, 2019.
U.S. Appl. No. 16/427,330 titled "Apparatuses and Methods for Storing Victim Row Data" filed May 30, 2019.
U.S. Appl. No. 15/876,566 entitled 'Apparatuses and Methods for Calculating Row Hammer Refresh Addresses in a Semiconductor Device' filed Jan. 22, 2018.
U.S. Appl. No. 15/656,084, titled: Apparatuses and Methods for Targeted Refreshing of Memory, filed Jul. 21, 2017.
U.S. Appl. No. 16/459,520 titled "Apparatuses and Methods for Monitoring Word Line Accesses", filed Jul. 1, 2019.
PCT Application No. PCT/US18/55821 "Apparatus and Methods for Refreshing Memory" filed Oct. 15, 2018.
U.S. Appl. No. 15/715,846, entitled "Semiconductor Device", filed Sep. 26, 2017.
U.S. Appl. No. 15/888,993, entitled "Apparatuses and Methods for Controlling Refresh Operations", filed Feb. 5, 2018.
U.S. Appl. No. 16/190,627 titled "Apparatuses and Methods for Targeted Refreshing of Memory" filed Nov. 14, 2018.
U.S. Appl. No. 15/281,818, entitled: "Semiconductor Device" filed Sep. 30, 2016.
Kim, et al., "Flipping Bits in MemoryWithout Accessing Them: An Experimental Study of DRAM Disturbance Errors", IEEE, Jun. 2014, 12 pgs.
U.S. Appl. No. 17/654,035, titled "Apparatuses and Methods for Dynamic Targeted Refresh Sieals", filed Mar. 8, 2022; pp. all pages of application as filed.
[Published as 2020-0219555-A1] U.S. Appl. No. 16/818,981 titled "Apparatuses and Methods for Staggered Timing of Targeted Refresh Operations" filed Mar. 13, 2020.
[Published as 2020-0219556-A1] U.S. Appl. No. 16/824,460, titled "Semiconductor Device Performing Row Hammer Refresh Operation", dated Mar. 19, 2020.
[Published as US-2020-0005857-A1] U.S. Appl. No. 16/025,844, titled "Apparatus and Methods for Triggering Row Hammer Address Sampling", filed Jul. 2, 2018.
[Published as US-2020-0176050-A1] U.S. Appl. No. 16/783,063, titled "Apparatus and Methods for Triggering Row Hammer Address Sampling", dated Feb. 5, 2020.
[Published as US-2020-0211632-A1] U.S. Appl. No. 16/232,837, titled "Apparatuses and Methods for Distributed Targeted Refresh Operations", filed Dec. 26, 2018.
[Published as US-2020-0211634-A1] U.S. Appl. No. 16/818,989, titled "Semiconductor Device Performing Row Hammer Refresh Operation", dated Mar. 13, 2020.

(56) References Cited

OTHER PUBLICATIONS

[Published as US-2020-0273517-A1] U.S. Appl. No. 16/286,187 titled "Apparatuses and Methods for Memort Mat Refresh Sequencing" filed Feb. 26, 2019.
[Published as US-20200294569-A1] U.S. Appl. No. 16/084,119, titled "Apparatuses and Methods for Pure-Time, Self Adopt Sampling for Row Hammer Refresh Sampling", filed Sep. 11, 2018.
[Published as US-2020-0294576-A1] U.S. Appl. No. 16/886,284 titled "Apparatuses and Methods for Access Based Refresh Timing" filed May 28, 2020.
[Published as US-2020-0294576-A1] U.S. Appl. No. 16/886,284, titled "Apparatuses and Methods for Access Based Refresh Timing", dated May 28, 2020.
[Published as US-2020-0321049-A1] U.S. Appl. No. 16/375,716 titled "Apparatuses and Methods for Staggered Timing of Targeted Refresh Operations" filed Apr. 4, 2019; pp. all.
[Published as US-2020-039563-A1] U.S. Appl. No. 17/008,396 titled "Apparatuses and Methods for Staggered Timing of Targeted Refresh Operations" filed Aug. 31, 2020.
U.S. Appl. No. 16/788,657, titled "Semiconductor Device Performing Row Hammer Refresh Operation", dated Feb. 12, 2020.
U.S. Appl. No. 16/537,981 titled "Apparatuses and Methods for Controlling Targeted Refresh Rates" filed Aug. 12, 2019.
U.S. Appl. No. 16/655,110 titled "Apparatuses and Methods for Dynamic Targeted Refresh Steals" filed Oct. 16, 2019.
U.S. Appl. No. 16/997,766 titled "Refresh Logic Circuit Layouts Thereof" filed Aug. 19, 2020.
U.S. Appl. No. 17/095,978 titled "Apparatuses and Methods for Controlling Refresh Timing" filed Nov. 12, 2020.
U.S. Appl. No. 17/175,485 titled "Apparatuses and Methods for Distributed Targeted Refresh Operations" filed Feb. 12, 2021.
U.S. Appl. No. 16/176,932, titled "Apparatuses and Methods for Access Based Refresh Timing", filed Oct. 31, 2018.
U.S. Appl. No. 16/208,217, titled "Semiconductor Device Performing Row Hammer Refresh Operation", filed Dec. 3, 2018.
U.S. Appl. No. 16/230,300, titled "Apparatuses and Methods for Staggered Timing of Targeted Refresh Operations" filed Dec. 21, 2018.
U.S. Appl. No. 16/290,730, titled "Semiconductor Device Performing Row Hammer Refresh Operation", filed Mar. 1, 2019.
U.S. Appl. No. 16/374,623, titled "Semiconductor Device Performing Row Hammer Refresh Operation", filed Apr. 3, 2019.
U.S. Appl. No. 16/431,641 titled "Apparatuses and Methods for Controlling Steal Rates" filed Jun. 4, 2019.
U.S. Appl. No. 16/549,411 titled "Apparatuses and Methods for Synamic Refresh Allocation" filed Aug. 23, 2019.
U.S. Appl. No. 16/682,606, titled "Apparatuses and Methods for Distributing Row Hammer Refresh Across a Memory Device", filed Nov. 13, 2019.
U.S. Appl. No. 17/030,018, titled "Apparatuses and Methods for Controlling Refresh Operations", filed Sep. 23, 2020, pp. all.
U.S. Appl. No. 16/994,338 titled "Apparatuses, Systems, and Methods for Memory Directed Access Pause" filed Aug. 14, 2020, pp. all.
U.S. Appl. No. 16/997,659 titled "Apparatuses, Systems, and Methods for Refresh Modes" filed Aug. 19, 2020; pp. all.
U.S. Appl. No. 17/127,654 titled "Apparatuses and Methods for Row Hammer Based Cache Lockdown" filed Dec. 18, 2020, pp. all.
U.S. Con U.S. Appl. No. 17/662,733, titled "Apparatuses, Systems, and Methods for Identifying Victim Rows in a Memorydevice Which Cannot Be Simultaneously Refreshed" filed May 10, 2022, pp. all pages of application as filed.
U.S. Appl. No. 17/731,529, titled "Apparatuses and Methods for Access Based Refresh Dperations"; filed Apr. 28, 2022; pp. all pages of the application as filed.
U.S. Appl. No. 17/731,645, titled "Apparatuses and Methods for Access Based Targeted Refresh Operations", filed Apr. 28, 2022; pp. all pages of application as filed.

\* cited by examiner

APPARATUSES AND METHODS FOR DYNAMIC REFRESH ALLOCATION

CROSS-REFERENCE TO RELATED APPLICATION(S)

This application is a continuation of U.S. patent application Ser. No. 16/549,411 filed Aug. 23, 2019 and issued as U.S. Pat. No. 11,302,374 on Apr. 12, 2022. The aforementioned application, and issued patent, is incorporated herein by reference, in its entirety, for any purpose.

BACKGROUND

This disclosure relates generally to semiconductor devices, and more specifically to semi conductor memory devices. In particular, the disclosure relates to volatile memory, such as dynamic random access memory (DRAM). Information may be stored on individual memory cells of the memory as a physical signal (e.g., a charge on a capacitive element). The memory may be a volatile memory, and the physical signal may decay over time (which may degrade or destroy the information stored in the memory cells), It may be necessary to periodically refresh the information in the memory cells by, for example, rewriting the information to restore the physical signal to an initial value.

As memory components have decreased in size, the density of memory cells has greatly increased. Repeated access to a particular memory cell or group of memory cells (often referred to as a 'row hammer') may cause an increased rate of data degradation in nearby memory cells. Memory cells affected by the row hammer effect may be identified and refreshed as part of a targeted refresh operation. These targeted refresh operations may take the place of (e.g., steal) time slots Which would otherwise be used for a background refresh operation. It may be desirable to balance the number of background refresh operations and targeted refresh operations.

DETAILED DESCRIPTION

Figure 1:
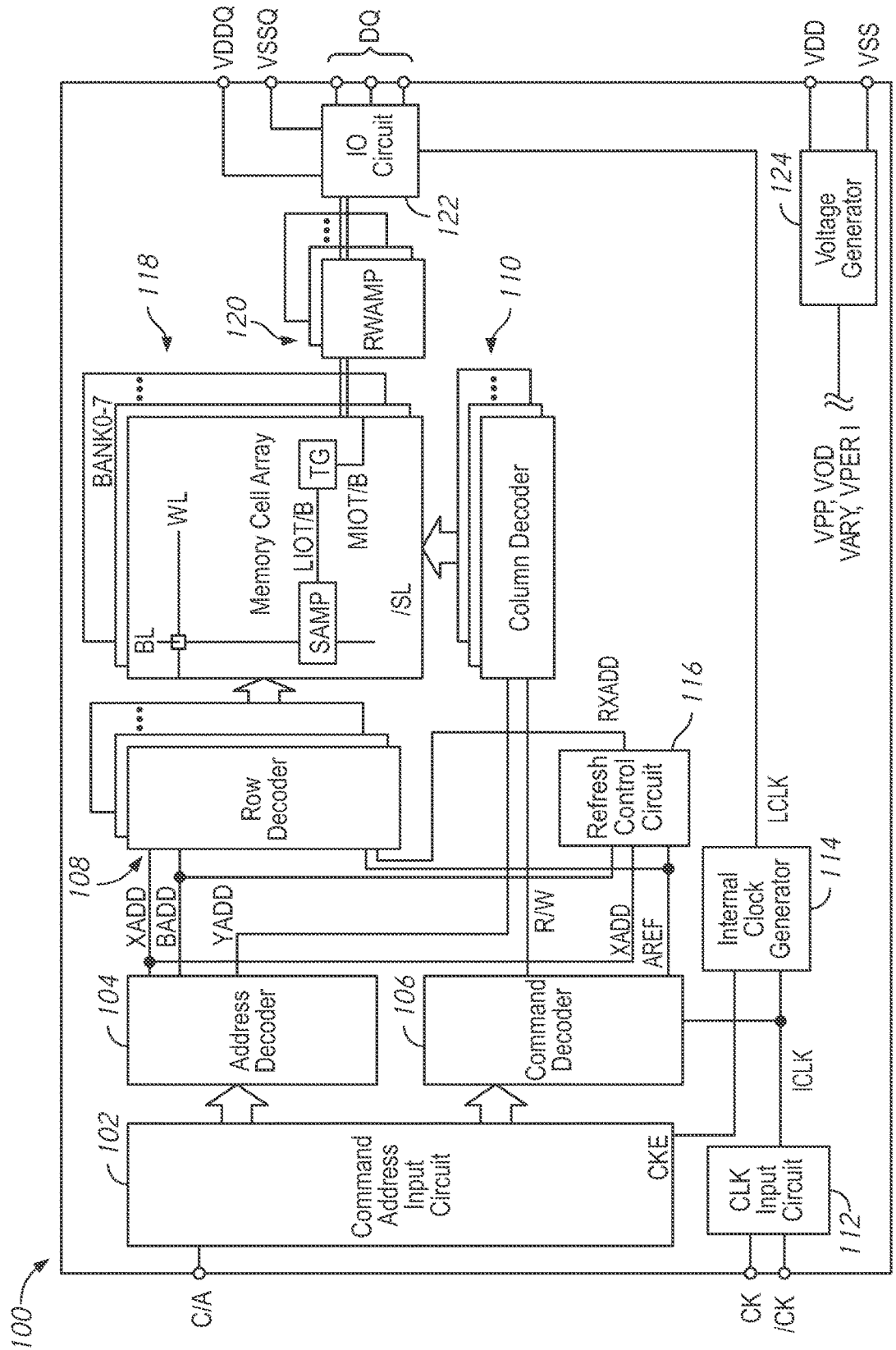
FIG. 1 is a block diagram of a semiconductor device according an embodiment of the disclosure.

The following description of certain embodiments is merely exemplary in nature and is in no way intended to limit the scope of the disclosure or its applications or uses. In the following detailed description of embodiments of the present systems and methods, reference is made to the accompanying drawings which form a part hereof, and which are shown by way of illustration specific embodiments in which the described systems and methods may be practiced. These embodiments are described in sufficient detail to enable those skilled in the art to practice presently disclosed systems and methods, and it is to be understood that other embodiments may be utilized and that structural and logical changes may be made without departing from the spirit and scope of the disclosure. Moreover, for the purpose of clarity, detailed descriptions of certain features will not be discussed when they would be apparent to those with skill in the art so as not to obscure the description of embodiments of the disclosure. The following detailed description is therefore not to be taken in a limiting sense, and the scope of the disclosure is defined only by the appended claims.

Information in a volatile memory device may be stored in memory cells (e.g., as a charge on a capacitive element), and may decay over time. The memory cells may be organized into rows (wordlines) and columns (bit lines), and the memory cells may be refreshed on a row-by-row basis. In order to prevent information from being lost or corrupted due to this decay, the memory may carry out a background refresh process, such as auto-refresh operations as part of a self-refresh mode. During a refresh operation, information may be rewritten to the wordline to restore its initial state. The auto-refresh operations may be performed on the wordlines of the memory in a sequence such that over time the wordlines of the memory are refreshed at a rate faster than the expected rate of data degradation.

Repeated access to a particular row of memory (e.g., an aggressor row) may cause an increased rate of decay in neighboring rows (e.g., victim rows) due, for example, to electromagnetic coupling between the rows. These repeated accesses may be part of a deliberate attack against the memory and/or may be due to 'natural' access patterns of the memory. The increased rate of decay in the victim rows may require that they be refreshed as part of a targeted refresh operation. The targeted refresh operations may be interspersed with the auto-refresh operations during the self-refresh mode. For example, the memory device may perform a set of refresh operations including a number of auto-refresh operations, and a number of targeted refresh operations. In some embodiments, the targeted refresh operations may 'steal' timeslots which would otherwise be used for auto-refresh operations. Since different types of access patterns may be better addressed by different amounts of targeted refresh operations and auto-refresh operations, it may be desirable to dynamically allocate targeted and auto-refresh operations.

The present disclosure is drawn to apparatuses, systems, and methods for dynamic refresh operations. A memory device may monitor access operations in order to determine an allocation between targeted and auto-refresh operations. The memory may determine if a row attack (as opposed to other types of access pattern) is occurring, and if so, determine what type of row attack is occurring and may allocate the targeted and auto-refresh operations based on these determinations. Each time the memory performs a set of refresh operations, it may determine how many targeted and auto-refresh operations to perform as part of the set based on if a row attack is occurring and what type of attack it is. For example, a memory device may include a first counter which counts a number of access operations. The memory may also store some number of addresses, and include a second counter which counts a number of times a received address matches one of the stored addresses. The states of the first and second counter may be used to determine how many of the refresh operations in a given set of refresh operations are targeted refresh operations and how many are auto-refresh operations.

FIG. 1 is a block diagram of a semiconductor device according an embodiment of the disclosure. The semiconductor device 100 may be a semiconductor memory device, such as a DRAM device integrated on a single semiconductor chip.

The semiconductor device 100 includes a memory array 118. The memory array 118 is shown as including a plurality of memory banks. In the embodiment of FIG. 1, the memory array 118 is shown as including eight memory banks BANK0-BANK7. More or fewer banks may be included in the memory array 118 of other embodiments. Each memory bank includes a plurality of word lines WL, a plurality of bit lines BL and /BL, and a plurality of memory cells MC arranged at intersections of the plurality of word lines WL and the plurality of bit lines BL and IBL. The selection of the word line WL is performed by a row decoder 108 and the selection of the bit lines BL and /BL is performed by a column decoder 110. In the embodiment of FIG. 1, the row decoder 108 includes a respective row decoder for each memory bank and the column decoder 110 includes a respective column decoder for each memory bank. The bit lines BL and /BL are coupled to a respective sense amplifier (SAMP). Read data from the bit line BL or /BL is amplified by the sense amplifier SAMP, and transferred to read/write amplifiers 120 over complementary local data lines (LIOT/B), transfer gate (TG), and complementary main data lines (MIOT/B). Conversely, write data outputted from the read/write amplifiers 120 is transferred to the sense amplifier SAMP over the complementary main data lines MIOT/B, the transfer gate TG, and the complementary local data lines LIOT/B, and written in the memory cell MC coupled to the bit line BL or /BL.

The semiconductor device 100 may employ a plurality of external terminals that include command and address (C/A) terminals coupled to a command and address bus to receive commands and addresses, and a CS signal, clock terminals to receive clocks CK and /CK, data terminals DQ to provide data, and power supply terminals to receive power supply potentials VDD, VSS, VDDQ, and VSSQ.

The clock terminals are supplied with external clocks CK and /CK that are provided to an input circuit 112. The external clocks may be complementary. The input circuit 112 generates an internal clock ICLK based on the CK and ICK clocks. The ICLK clock is provided to the command decoder 110 and to an internal clock generator 114. The internal clock generator 114 provides various internal clocks LCLK based on the ICLK clock. The LCLK clocks may be used for timing operation of various internal circuits. The internal data clocks LCLK are provided to the input/output circuit 122 to time operation of circuits included in the input/output circuit 122, for example, to data receivers to time the receipt of write data.

The C/A terminals may be supplied with memory addresses. The memory addresses supplied to the C/A terminals are transferred, via a command/address input circuit 102, to an address decoder 104. The address decoder 104 receives the address and supplies a decoded row address XADD to the row decoder 108 and supplies a decoded column address YADD to the column decoder 110. The address decoder 104 may also supply a decoded bank address BADD, which may indicate the bank of the memory array 118 containing the decoded row address XADD and column address YADD. The C/A terminals may be supplied with commands. Examples of commands include timing commands for controlling the timing of various operations, access commands for accessing the memory, such as read commands for performing read operations and write commands for performing write operations, as well as other commands and operations. The access commands may be associated with one or more row address XADD, column address YADD, and bank address BADD to indicate the memory cell(s) to be accessed.

The commands may be provided as internal command signals to a command decoder 106 via the command/address input circuit 102. The command decoder 106 includes circuits to decode the internal command signals to generate various internal signals and commands for performing operations. For example, the command decoder 106 may provide a row command signal to select a word line and a column command signal to select a bit line.

The device 100 may receive an access command which is a read command. When a read command is received, and a bank address, a row address and a column address are timely supplied with the read command, read data is read from memory cells in the memory array 118 corresponding to the row address and column address. The read command is received by the command decoder 106, which provides internal commands so that read data from the memory array 118 is provided to the read/write amplifiers 120. The read data is output to outside from the data terminals DQ via the input/output circuit 122.

The device 100 may receive an access command which is a write command. When the write command is received, and a bank address, a row address and a column address are timely supplied with the write command, write data supplied to the data terminals DQ is written to a memory cells in the memory array 118 corresponding to the row address and column address. The write command is received by the command decoder 106, which provides internal commands so that the write data is received by data receivers in the input/output circuit 122. Write clocks may also be provided to the external clock terminals for timing the receipt of the write data by the data receivers of the input/output circuit 122. The write data is supplied via the input/output circuit 122 to the read/write amplifiers 120, and by the read/write amplifiers 120 to the memory array 118 to be written into the memory cell MC.

The device 100 may also receive commands causing it to carry out one or more refresh operations as part of a self-refresh mode. In some embodiments, the self-refresh mode command may be externally issued to the memory device 100. In some embodiments, the self-refresh mode command may be periodically generated by a component of the device. In some embodiments, when an external signal indicates a self-refresh entry command, the refresh signal AREF may also be activated. The refresh signal AREF may be a pulse signal which is activated when the command decoder 106 receives a signal which indicates entry to the self-refresh mode. The refresh signal AREF may be activated once immediately after command input, and thereafter may be cyclically activated at desired internal timing. The refresh signal AREF may be used to control the timing of refresh operations during the self-refresh mode. Thus, refresh operations may continue automatically. A self-refresh exit command may cause the automatic activation of the refresh signal AREF to stop and may cause the device 100 to return to an idle state and/or resume other operations.

The refresh signal AREF is supplied to the refresh control circuit 116. The refresh control circuit 116 supplies a refresh row address RXADD to the row decoder 108, which may refresh one or more wordlines WL indicated by the refresh row address RXADD. In some embodiments, the refresh address RXADD may represent a single wordline. In some embodiments, the refresh address RXADD may represent multiple wordlines, which may be refreshed sequentially or simultaneously by the row decoder 108. In some embodiments, the number of wordlines represented by the refresh address RXADD may vary from one refresh address to another. The refresh control circuit 116 may control a timing of the refresh operation, and may generate and provide the refresh address RXADD. The refresh control circuit 116 may be controlled to change details of the refreshing address RXADD (e.g., how the refresh address is calculated, the timing of the refresh addresses, the number of wordlines represented by the address), or may operate based on internal logic.

The refresh control circuit 116 may selectively output a targeted refresh address (e.g., which specifies one or more victim address based on an aggressor) or an automatic refresh address (e.g., from a sequence of auto-refresh addresses) as the refresh address RXADD. Based on the type of refresh address RXADD, the row decoder 108 may perform a targeted refresh or auto-refresh operation. The automatic refresh addresses may be from a sequence of addresses which are provided based on activations of the refresh signal AREF. The refresh control circuit 116 may cycle through the sequence of auto-refresh addresses at a rate determined by AREF. In some embodiments, the auto-refresh operations may generally occur with a timing such that the sequence of auto-refresh addresses is cycled such that no information is expected to degrade in the time between auto-refresh operations for a given wordline. In other words, auto-refresh operations may be performed such that each wordline is refreshed at a rate faster than the expected rate of information decay.

The refresh control circuit 116 may also determine targeted refresh addresses which are addresses that require refreshing (e.g., victim addresses corresponding to victim rows) based on the access pattern of nearby addresses (e.g., aggressor addresses corresponding to aggressor rows) in the memory array 118. The refresh control circuit 116 may use one or more signals of the device 100 to calculate the targeted refresh address RXADD. For example, the refresh address RXADD may be a calculated based on the row addresses XADD provided by the address decoder.

In some embodiments, the refresh control circuit 116 may sample the current value of the row address XADD provided by the address decoder 104 along a row address bus, and determine a targeted refresh address based on one or more of the sampled addresses. The sampled addresses may be stored in a data storage unit of the refresh control circuit. When a row address XADD is sampled, it may be compared to the stored addresses in the data storage unit. In some embodiments, the aggressor address may be determined based on the sampled and/or stored addresses. For example, the comparison between the sampled address and the stored addresses may be used to update a count value (e.g., an access count) associated with the stored addresses and the aggressor address may be calculated based on the count values. The refresh addresses RXADD may then be used based on the aggressor addresses.

While in general the present disclosure refers to determining aggressor and victim wordlines and addresses, it should be understood that as used herein, an aggressor wordline does not necessarily need to cause data degradation in neighboring wordlines, and a victim wordline does not necessarily need to be subject to such degradation. The refresh control circuit 116 may use some criteria to judge whether an address is an aggressor address, which may capture potential aggressor addresses rather than definitively determining which addresses are causing data degradation in nearby victims. For example, the refresh control circuit 116 may determine potential aggressor addresses based on a pattern of accesses to the addresses and this criteria may include some addresses which are not aggressors, and miss some addresses which are. Similar victim addresses may be determined based on which wordlines are expected to be effected by aggressors, rather than a definitive determination of which wordlines are undergoing an increased rate of data decay.

The refresh address RXADD may be provided with a timing based on a timing of the refresh signal AREF. The refresh control circuit 116 may have time slots corresponding to the timing of AREF, and may provide one or more refresh addresses RXADD during each time slot. In some embodiments, the targeted refresh address may be issued in (e.g., "steal") a time slot which would otherwise have been assigned to an auto-refresh address. In some embodiments, certain time slots may be reserved for targeted refresh addresses, and the refresh control circuit 116 may determine whether to provide a targeted refresh address, not provide an address during that time slot, or provide an auto-refresh address instead during the time slot.

When the device 100 performs a set of refresh operations, the refresh control circuit 116 may provide a set of refresh addresses RXADD. For example, responsive to the refresh signal AREF, the refresh control circuit 116 may provide a set of K different refresh addresses RXADD, each of Which may be associated with a refresh operation. In some embodiments, the set of K refresh operations may be responsive to a single activation of the refresh signal AREF. In some embodiments, the set of 1 refresh operations may be responsive to multiple activations of the refresh signal AREF. A first number (I) of the set of refresh addresses RXADD may be targeted refresh addresses used for targeted refresh operations, and a second number (J), of the set may be used for auto-refresh operations. The refresh control circuit 116 may determine the values of I and J for each set of refresh operations and thus the proportion of auto-refresh and targeted refresh operations in each set of refresh operations.

In some embodiments, the total number of refresh operations in the set, K, may be a pre-determined number which does not change from refresh set to refresh set. In some embodiments, all of the refresh operations may be used for either a targeted refresh operation or an auto-refresh operation (e.g., I+J=K). For example, a portion of the set of refresh operations may be designated for targeted refresh operations, and a remainder of the set of refresh operations may be used for auto-refresh operations. By altering the size of the portion, the number of targeted and auto-refresh operations in the set may be changed. In some embodiments, the total number of refresh operations in a set may be allowed to change from set to set. In such an embodiment, if the amount of targeted (I) or auto-refresh (J) operations is changed, the total number of refresh operations in a set (K) may also change.

In some embodiments, the device 100 may 'skip' one or more of the K refresh operations. For example, in some embodiments, when a targeted refresh operation is called for, but refresh control circuit 116 has not identified any aggressor addresses, the device 100 may skip the targeted refresh operation and not perform any refresh operation. In such embodiments, if H represents the number of skipped refreshes, then the total number of refresh operations may be the sum of auto-refreshes, targeted refreshes, and skipped refreshes (e.g., K=I+J+H). Accordingly, the device 100 may dynamically allocate refresh operations by determining a proportion of the refresh operations which are targeted refreshes, a proportion which are auto-refreshes, and a proportion which are skipped refreshes.

The power supply terminals are supplied with power supply potentials VDD and VSS. The power supply potentials VDD and VSS are supplied to an internal voltage generator circuit 124. The internal voltage generator circuit 124 generates various internal potentials VPP, VOD, VARY, VPERI, and the like based on the power supply potentials VDD and VSS supplied to the power supply terminals. The internal potential VPP is mainly used in the row decoder 108, the internal potentials VOD and VARY are mainly used in the sense amplifiers SAMP included in the memory array 118, and the internal potential VPERI is used in many peripheral circuit blocks.

The power supply terminals are also supplied with power supply potentials VDDQ and VSSQ. The power supply potentials VDDQ and VSSQ are supplied to the input/output circuit 122, The power supply potentials VDDQ and VSSQ supplied to the power supply terminals may be the same potentials as the power supply potentials VDD and VSS supplied to the power supply terminals in an embodiment of the disclosure. The power supply potentials VDDQ and VSSQ supplied to the power supply terminals may be different potentials from the power supply potentials VDD and VSS supplied to the power supply terminals in another embodiment of the disclosure. The power supply potentials VDDQ and VSSQ supplied to the power supply terminals are used for the input/output circuit 122 so that power supply noise generated by the input/output circuit 122 does not propagate to the other circuit blocks.

Figure 2:
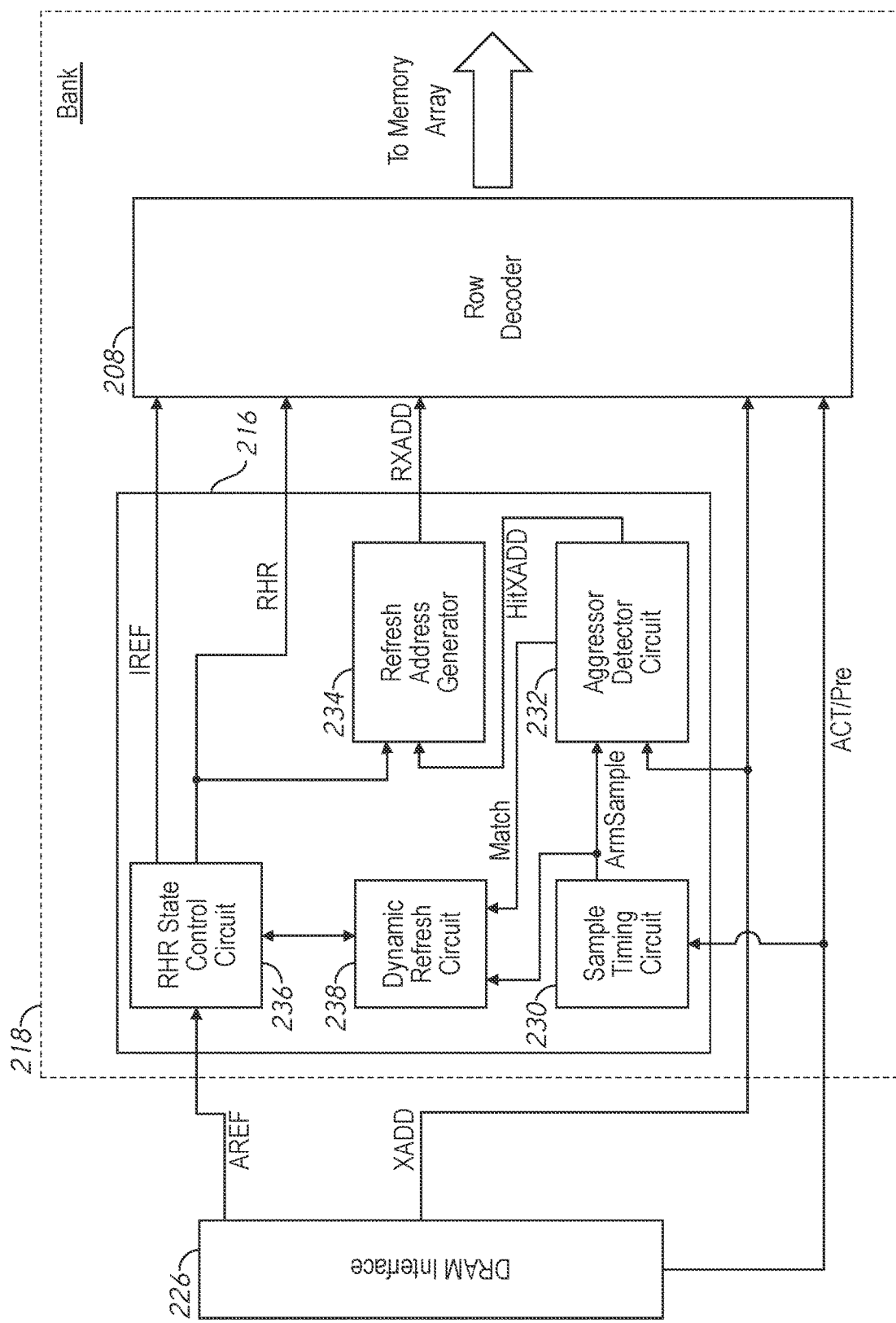
FIG. 2 is a block diagram of a refresh control circuit according to an embodiment of the present disclosure.

FIG. 2 is a block diagram of a refresh control circuit according to an embodiment of the present disclosure. The refresh control circuit 216 may, in some embodiments, be included in the refresh control circuit 116 of FIG. 1, Certain internal components and signals of the refresh control circuit 216 are shown to illustrate the operation of the refresh control circuit 216. The dotted line 218 is shown to represent that in certain embodiments, each of the components (e.g., the refresh control circuit 216 and row decoder 208) may correspond to a particular bank of memory, and that these components may be repeated for each of the banks of memory. Thus, there may be multiple refresh control circuits 216 and row decoders 208. For the sake of brevity, only components for a single bank will be described.

A DRAM interface 226 may provide one or more signals to an address refresh control circuit 216 and row decoder 208. The refresh control circuit 216 may include a sample timing circuit 230, an aggressor detector circuit 232, a row hammer refresh (RHR) state control circuit 236 and a refresh address generator 234. The DRAM interface 226 may provide one or more control signals, such as a refresh signal AREF, and a row address XADD. The refresh control circuit 216 provides refresh address RXADD with timing based on the refresh signal AREF, wherein some of the refresh addresses are based on the received row address XADD.

The aggressor detector circuit 232 may sample the current row address XADD responsive to an activation a sampling signal ArmSample. The aggressor detector circuit 232 may be coupled to all of the row addresses XADD along the row address bus, but may only receive (e.g., process, pay attention to) the current value of the row address XADD when there is an activation of the sampling signal ArmSample. As used herein, an activation of a sample may refer to any portion of a signals waveform that a circuit responds to. For example, if a circuit responds to a rising edge, then a signal switching from a low level to a high level may be an activation, One example type of activation is a pulse, where a signal switches from a low level to a high level for a period of time, and then back to the low level. This may trigger circuits which respond to rising edges, falling edges, and/or signals being at a high logical level.

In some embodiments, the sampled addresses may be stored in the aggressor circuit 232 and/or compared to previously stored addresses. The aggressor detector circuit 232 may provide a match address HitXADD based on a currently sampled row address XADD and/or previously sampled row addresses. The RHR state control circuit 236 may provide the signal RHR to indicate that a row hammer refresh (e.g., a refresh of the victim rows corresponding to an identified aggressor row) should occur. The RHR state control circuit 236 may also provide an internal refresh signal IREF, to indicate that an auto-refresh should occur. A dynamic refresh circuit 238 may monitor operations of the refresh control circuit 216 to determine an allocation of targeted and auto-refresh operations, and may direct the RHR state control circuit 236 to provide the signals RHR and IREF accordingly.

Responsive to an activation of RHR or IREF, the refresh address generator 234 may provide a refresh address RXADD, which may be an auto-refresh address or may be one or more victim addresses corresponding to victim rows of the aggressor row corresponding to the match address HitXADD. The RHR state control circuit 236 may provide a set of activations of RHR and IREF responsive to the refresh signal AREF, and the number of activations of the signals RHR and IREF may be based on the dynamic refresh circuit 238, The row decoder 208 may perform a refresh operation responsive to the refresh address RXADD and the row hammer refresh signal RHR. The row decoder 208 may perform an auto-refresh operation based on the refresh address RXADD and the internal refresh signal IREF. Accordingly, the proportion of targeted refresh and auto-refresh operations may be determined by the signals IREF and RHR provided by the RHR state control circuit 236.

The DRAM interface 226 may represent one or more components which provides signals to components of the bank. In some embodiments, the DRAM interface 226 may represent a memory controller coupled to the semiconductor memory device (e.g., device 100 of FIG. 1). In some embodiments, the DRAM interface 226 may represent components such as the command address input circuit 102, the address decoder 104, and/or the command decoder 106 of FIG. 1. The DRAM interface 226 may provide a row address XADD, the refresh signal AREF, and access signals such as an activation signal ACT and a pre-charge signal PRE. The refresh signal AREF may be a periodic signal which may indicate when an auto-refresh operation is to occur. The access signals ACT and PRE may generally be provided as part of an access operation along with a row address XADD. The activation signal ACT may be provided to activate a given bank of the memory. The pre-charge signal PRE may be provided to pre-charge the given bank of the memory. The row address XADD may be a signal including multiple bits (which may be transmitted in series or in parallel) and may correspond to a specific row of an activated memory bank.

In the example embodiment of FIG. 2, the refresh control circuit 216 uses sampling to monitor a portion of the row addresses XADD provided along the row address bus. Accordingly, instead of responding to every row address, the refresh control circuit 216 may sample the current value of the row address XADD on the row address bus, and may determine which addresses are aggressors based on the sampled row addresses. The timing of sampling by the refresh control circuit 216 may be controlled by the sample timing circuit 230 which provides the sampling signal ArmSample. The sample timing circuit 230 may provide activations of the sampling signal ArmSample, and each activation of the signal ArmSample may indicate that a current value of the row address should be sampled. An activation of ArmSample may be a 'pulse', where ArmSample is raised to a high logic level and then returns to a low logic level. The activations of the signal ArmSample may be provided with periodic timing, random timing, semi-random timing, pseudo-random timing, or combinations thereof. In other embodiments, sampling may not be used, and the aggressor detector circuit 232 may receive every value of the row address XADD along the row address bus.

The aggressor detector circuit 232 may receive the row address XADD from the DRAM interface 226 and the signal ArmSample from the sample timing circuit 230. The row address XADD on the row address bus may change as the DRAM interface 226 directs access operations (e.g., read and write operations) to different rows of the memory cell array (e.g., memory cell array 118 of FIG. 1). Each time the aggressor detector circuit 232 receives an activation (e.g., a pulse) of the signal ArmSample, the aggressor detector circuit 232 may sample the current value of XADD.

As described in more detail herein, the aggressor detector circuit 232 may determine aggressor addresses based on one or more of the sampled row addresses, and then may provide the determined aggressor address as the match address HitXADD. The aggressor detector circuit 232 may include a data storage unit (e.g., a number of registers), Which may be used to store sampled row addresses. When the aggressor detector circuit 232 samples a new value of the row address XADD (e.g., responsive to an activation of ArmSample) it may compare the sampled row address to the addresses stored in the data storage unit. If there is a match between the sampled address and one of the stored addresses, the aggressor detector circuit 232 may provide a match signal Match. In some embodiments, the match address HitXADD may be one of the addresses stored in the aggressor detector circuit 232 which has been matched by the sampled address XADD the most frequently.

The dynamic refresh circuit 238 may dynamically allocate the number of targeted refresh operations and the number of auto-refresh operations. The dynamic refresh circuit 238 may receive the sampling signal ArmSample from the sample timing circuit 230 and the match signal Match from the aggressor detector circuit 232. Based on these signals, the dynamic refresh circuit 238 may control the RHR state control circuit 236 to alter the number of targeted and auto-refresh operations in a given set of refresh operations (e.g., the proportion of targeted and auto-refresh operations). For example, the dynamic refresh circuit may count a number of times that the signal ArmSample is received, and also count a number of times that the signal Match is received. Each of these counts may be compared to a respective threshold, and whether the count is over the threshold may determine what proportion of targeted and auto-refresh operations the dynamic refresh circuit 238 instructs the RHR state control circuit 236 to perform. The counts stored in the dynamic refresh circuit 238 may, in some embodiments, be reset to an initial value (e.g., 0, 1) when a refresh occurs (for example, as indicated by the refresh signal AREF).

The RHR state control circuit 236 may receive the refresh signal AREF and provide the row hammer refresh signal RHR. The refresh signal AREF may be periodically generated and may be used to control the timing of refresh operations. The memory device may carry out a sequence of auto-refresh operations in order to periodically refresh the rows of the memory device. The RHR signal may be generated in order to indicate that the device should refresh a particular targeted row (e.g., a victim row) instead of an address from the sequence of auto-refresh addresses. The RIM state control circuit 236 may also provide an internal refresh signal IREF, which may indicate that an auto-refresh operation should take place. In some embodiments, the signals RHR and IREF may be generated such that they are not active at the same time (e.g., are not both at a high logic level at the same time). The number of activations of RHR and IREF in a given set of refresh operations may be determined by the dynamic refresh circuit. In some embodiments, IREF may be activated for every refresh operation, and an auto-refresh operation may be performed unless RHR is also active, in which case a targeted refresh operation is performed instead. In such an embodiment, the number of activations of IREF may remain constant, and the number of activations of RHR may be controlled by the dynamic refresh circuit 238.

In some embodiments, the refresh control circuit 216 may perform multiple refresh operations responsive to each activation of the refresh signal AREF. For example, each time the refresh signal AREF is received, the refresh control circuit 216 may perform N different refresh operations, by providing N different refresh addresses RXADD. Each refresh operation may be referred to as a 'pump'.

The refresh address generator 234 may receive the row hammer refresh signal RHR and the match address HitXADD. The match address HitXADD may represent an aggressor row. The refresh address generator 234 may determine the locations of one or more victim rows based on the match address HitXADD and provide them as the refresh address RXADD when the signal MIR indicates a targeted refresh operation. In some embodiments, the victim rows may include rows which are physically adjacent to the aggressor row (e.g., HitXADD+1 and HitXADD−1). In some embodiments, the victim rows may also include rows which are physically adjacent to the physically adjacent rows of the aggressor row (e.g., HitXADD+2 and HitXADD−2), Other relationships between victim rows and the identified aggressor rows may be used in other examples. For example, +/−3, +/−4, and/or other rows may also be refreshed.

The refresh address generator 234 may determine the value of the refresh address RXADD based on the row hammer refresh signal RHR. In some embodiments, when the signal RHR is not active, the refresh address generator 234 may provide one of a sequence of auto refresh addresses. When the signal RHR is active, the refresh address generator 234 may provide a targeted refresh address, such as a victim address, as the refresh address RXADD. In some embodiments, the refresh address generator 234 may count activations of the signal RHR, and may provide closer victim rows (e.g., HitXADD+/−1) more frequently than victim rows which are further away from the aggressor address (e.g., HitXADD+/−2).

The row decoder 208 may perform one or more operations on the memory array (not shown) based on the received signals and addresses. For example, responsive to the activation signal ACT and the row address XADD (and IREF and RHR being at a low logic level), the row decoder 208 may direct one or more access operations (for example, a read operation) on the specified row address XADD. Responsive to the RHR signal being active, the row decoder 208 may refresh the refresh address RXADD.

Figure 3:
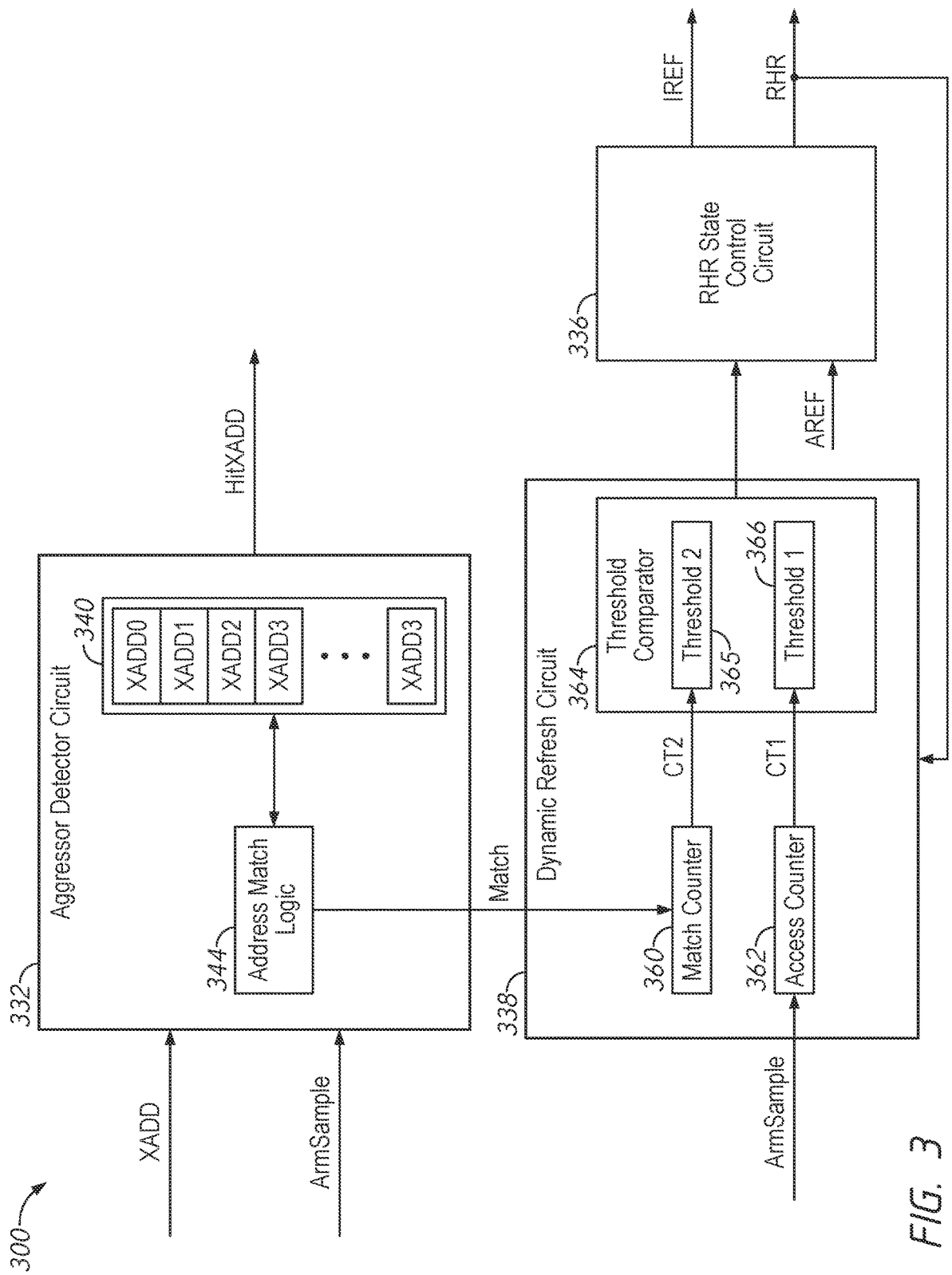
FIG. 3 is block diagram of a refresh control circuit according to an embodiment of the present disclosure.

FIG. 3 is block diagram of a refresh control circuit according to an embodiment of the present disclosure. The refresh control circuit 300 shows certain components that may, in some embodiments, be used in the refresh control circuit 116 of FIG. 1 and/or 216 of FIG. 2. For brevity, the refresh control circuit 300 omits certain components (e.g., the sample timing circuit 230 and refresh address generator 234 of FIG. 2) in order to focus on the dynamic refresh circuit 338, The refresh control circuit 300 includes an aggressor detector circuit 332 a dynamic refresh circuit 338 and RHR state control circuit 336 which may, in some embodiments, be included in the aggressor detector circuit 232, dynamic refresh circuit 238, and RHR state control circuit 236 of FIG. 2 respectively.

The aggressor detector circuit 332 includes a data storage unit 340, which is used to store a number of row addresses (here labeled XADD0 to XADDn). The data storage unit 340 may include a number of files (e.g., registers) which each store one of the stored addresses. When a sampling signal ArmSample is received, the current value of the row address XADD on the row address bus may be sampled. The aggressor detector circuit 332 includes address match logic 344 which compares the sampled address XADD to the stored addresses in the data storage unit 340. If the sampled address XADD matches one of the stored addresses, the signal Match may be provided. The aggressor detector circuit 332 may provide the match address HitXADD based on the number of times the sampled address XADD matches the stored addresses in the data storage unit 340.

The dynamic refresh circuit 338 includes an access counter 362 which counts a number of times that the sample signal ArmSample is received. The access counter 362 may count a number of times that a row address is received (e.g., sampled) by the aggressor detector circuit 332. Counting a number of sampled addresses may act as a proxy for a number of access operations in the memory. Iii some embodiments, the dynamic refresh circuit 338 may use one or more other signals to count access operations. For example, in some embodiments, the access counter 362 may alternatively (or additionally) count other signals associated with access operations, such as the signals ACT/Pre. The dynamic refresh circuit 338 also includes a match counter 360 which counts a number of times the signal Match is received from the aggressor detector circuit 332 to indicate that a sampled (e.g., received) row address matches one of the addresses stored in the data storage unit 340.

Since the match counter 360 and the access counter 362 may generally function in a similar manner, for the sake of brevity only the match counter 360 will be described in detail. The match counter 360 may include a count value, which represents the current number of counts of the match signal. For example the count value may be stored as a binary number (e.g., in a register with each bit in a different latch circuit similar to the registers of the data storage unit 340). When the signal Match is received, the match counter 360 may update the count value, for example by incrementing the count value. Other mechanisms for counting the signal may be used in other embodiments.

The access counter 362 provides an access count signal CT1 which indicates the current count value of the access counter 362. Similarly, the match counter 360 provides a match count signal CT2 which indicates the current value of the match counter 360. The dynamic refresh circuit 338 includes a threshold comparator circuit 364 which compares the counts CT1 and CT2 to a respective first threshold 366 and second threshold 365. Based on the comparisons of the counts CT1 and CT2 to the thresholds 365-366, the dynamic refresh circuit 338 may direct the RHR state control circuit 336 to allocate a particular number of the next set of refresh operations to targeted refresh operations e.g., by providing the signal RHR) with the remainder of the refresh operations in the set being allocated to auto-refresh operations.

Responsive to the refresh operations, the match counter 360 and access counter 362 may reset so that their respective count value resets to an initial value (e.g., 0 or 1). In some embodiments, the match counter 360 and access counter 362 may reset after a targeted refresh operation, for example, by resetting after the signal RHR is provided. In some embodiments the counters may reset responsive to one or more other command signals (either alternatively or additionally), and/or a count of activations of that command signal. For example, signals such as the refresh signal AREF, a reset signal RESET, the activation signal ACT, and or a self-refresh exit command may be used. In some embodiments, a timer circuit (not shown) and/or a timing signal of the memory may be used to control the resetting of the counters.

Based on the logic of the threshold comparator circuit 364, the RHR state control circuit 336 may be directed to allocate different numbers (e.g., different proportions) of the reset operations to auto-refresh operations and targeted refresh operations. For example, if the access count CT1 is below the first threshold 366, it may indicate that the memory is not experiencing a hammer attack. Accordingly, the dynamic refresh circuit 338 may direct the RHR state control circuit 336 to perform a 'normal' allocation of auto-refresh and targeted refresh operations. For example, if each set of refresh operations includes 32 refresh operations, when the access count CT1 is below the first threshold 366, 12 of the refresh operations may be targeted refresh operations and 20 may be auto-refresh operations.

If the access count CT1 is above the first threshold 366, the match count CT2 may be compared to the second threshold 365. If the access count is above the first threshold 366 it may indicate that the memory is experiencing a deliberate hammer attack. The match count CT2 may be used to determine the type of hammer attack that the memory is experiencing. For example, if the match count CT2 is above the second threshold 365, it may indicate that relatively few rows (e.g., different values of XADD) are being used as part of the attack. Accordingly, the dynamic refresh circuit 338 may direct the RHR state control circuit 336 to allocate more of the refresh operations to targeted refresh operations in order to more frequently refresh the victims of the few rows involved in the hammer attack. For example, sticking with the scenario where each set of refresh operations includes 32 refresh operations, when the access count CT1 and the match count CT2 are both above their respective thresholds, 16 refresh operations may be used for targeted refresh operations and 16 refresh operations may be used for auto-refresh operations.

If the access count CT1 is above the first threshold 366 but the match count 360 is not above the second threshold 365, it may indicate that a hammer attack is occurring, and that a relatively large number of different rows are involved in the attack. In this scenario, the dynamic refresh circuit 338 may direct the RHR state control circuit 336 to increase the proportion of auto-refresh operations. Since the aggressor detector circuit 332 can only track a certain number of row addresses at a time (e.g., in the data storage unit 340), it may be more efficient to refresh the victim rows by blindly refreshing them as part of the auto-refresh operation, rather than attempting to target them for refreshing as part of a targeted refresh operation. Accordingly, in the example scenario with 32 refresh operations, 4 may be used for targeted refresh operations. While 28 are used for auto-refresh operations.

In some embodiments, the threshold comparator 364 may compare the match count CT2 to multiple thresholds and may set the number of targeted and auto-refresh based on that comparison. For example, there may be a second threshold 365 and a third threshold (not shown) which is lower than the second threshold 365. If the count CT2 is above the second threshold 365 a first allocation of refresh operations may be used. If the count CT2 is between the second threshold 365 and the third threshold, a second allocation of refresh operations may be used. If the count CT2 is below the third threshold, a third allocation of refresh operations may be used.

Figure 4:
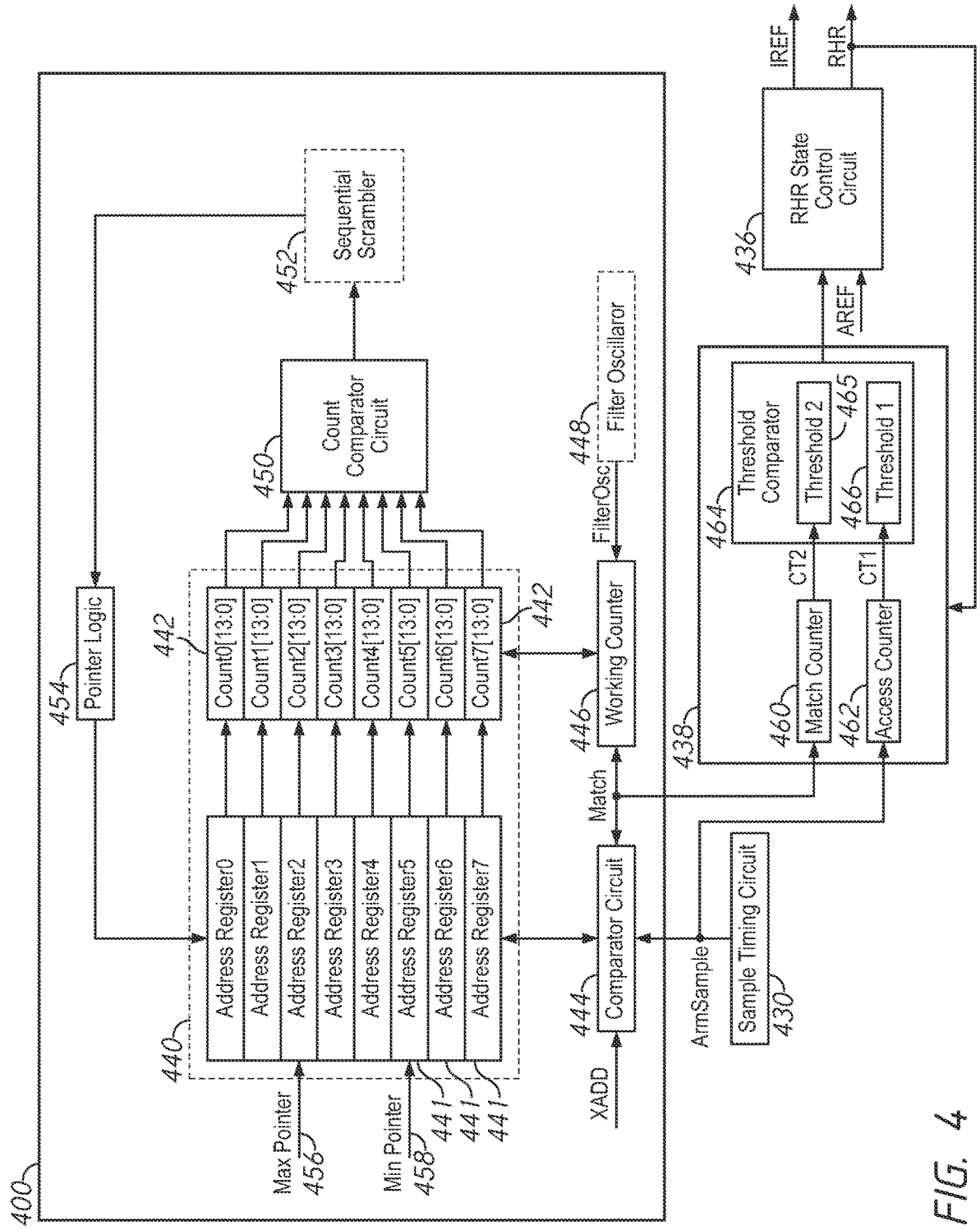
FIG. 4 is a block diagram of an aggressor detector circuit according to an embodiment of the present disclosure.

FIG. 4 is a block diagram of an aggressor detector circuit according to an embodiment of the present disclosure. The aggressor detector circuit 400 may, in some embodiments, be included in the aggressor detector circuits 232 of FIG. 2 and/or 332 of FIG. 3. Also shown in FIG. 4 is a sample timing circuit 430, dynamic refresh circuit 438, and RHR state control circuit 436. The sample timing circuit 430 may generally be similar to the sample timing circuit 230 of FIG. 2, the dynamic refresh circuit 438 may generally be similar to the dynamic refresh circuit 238 of FIG. 2 and/or 338 of FIG. 3, and the RHR state control circuit 436 may generally be similar to the RHR state control circuit 236 of FIG. 2 and/or 336 of FIG. 3. For the sake of brevity these components will not be described again in detail.

The aggressor detector circuit 400 includes a data storage unit 440 which stores a number of row addresses. In particular, the data storage unit 440 may include a number of registers 441 (e.g., files), each of which may store a row address. For example, each register 441 may include a number of memory cells, such as latch circuits, which may store a bit of data. Each register may include a number of memory cells based on the number of bits in a row address. In some embodiments, each register may include a same number of memory cells as the number of bits in a row address. For example, if the row address includes 17 bits, each register may include 17 memory cells. More or fewer bits for each row address may be used in other examples. In some embodiments, each register 341 may include one or more additional memory cells, which may be used to store additional information related to the register and/or row address stored therein.

The data storage unit 440 has a number of registers 441 to store a number of row addresses. The number of bits (e.g., latch circuits) in each register 441 may generally be referred to as a width of the data storage unit 440, while the number of registers 441 in the data storage unit 440 may generally be referred to as the depth of the data storage unit 440. In the embodiment of FIG. 4, eight registers 441 are shown, which in turn may store up to eight row addresses. Other numbers of registers 441, for example four or sixteen registers, may be used in other example embodiments.

Since the refresh behavior when the count CT1 is over the first threshold 466 and the count value CT2 is used to indicate an attack pattern with too many different row addresses for the data storage unit 440 to handle, the second threshold 465 may be based on a depth of the data storage unit 440. For example, the greater the depth of the data storage unit 440, the lower the second threshold 465 may be.

Each of the registers 441 is associated with a count value 442. Each count value 442 may be a numerical value which represents a number of accesses to the row address stored in the associated one of the registers 441, In some embodiments, the count values 442 may be stored as a binary number. For example, each count value 442 may be a register (e.g., similar to the registers 441) with a number of latch circuits, each of which stores a bit of a binary number. The number of bits may determine a maximum value of the count values 442. For example, in some embodiments, each of the count values 442 may be a 14 bit number, and thus each count value may represent any number from 0 to 16,383. Other sizes of count value may be used in other embodiments. In some embodiments, the count values 442 may be part of the same data storage unit 440 as the registers 441. In some embodiments, each of the registers 441 may include the associated count value 442, and thus each register 441 may include a certain number of bits (e.g., latch circuits) to store the address, and a certain number of bits (e.g., latch circuits) to store the count value 442.

When one or more of the count values 442 is updated, it may be read out to a working counter circuit 446. Based on one or more signals from the comparator circuit 444 and/or the optional filter oscillator circuit 448 as described herein, the working counter circuit 446 may retrieve a count value 442, update the value of that count value 442 and then write back the updated count value to the data storage unit 440.

In some embodiments, rather than being stored as a binary number in a data storage unit 440, the count values 442 may be stored in other manners (e.g., in counter circuits) which may intrinsically update the stored count value 442. In some embodiments, certain components, such as the working counter circuit 446 may not be necessary, and may be omitted.

The aggressor detector circuit 400 receives the row address XADD along the row address bus. Responsive to an activation of the sampling signal ArmSample, a comparator circuit 444 compare the current value of the row address XADD to the addresses stored in the data storage unit 440. The comparator circuit 444 may determine if the received row address XADD is an exact match (e.g., the same sequence of bits) as any of the addresses stored in the data storage unit 440. The comparator 444 may provide the signal Match when the received address is a match for one of the addresses stored in the data storage unit 440, In some embodiments, the received address XADD may be compared to all of the stored addresses sequentially. In some embodiments, the received address XADD may be compared to all of the stored addresses simultaneously.

In some embodiments, the registers 441 may include content addressable memory (CAM) cells as the latch circuits which store the bits of the row address (and/or count values 442). The CAM cells may be capable of determining if a provided bit matches the state of the bit stored in the CAM cell. The signals from each of the CAM cells in one of the registers 441 may be coupled together with AND logic. Accordingly, when a row address XADD is provided to the data storage unit 440, each of the registers 441 may provide the signal Match with a state which indicates if the row address is a match for the address in that register 441 or not. Accordingly, in some embodiments where CAM cells are used in the registers 441, the registers 441 may perform the comparison operation themselves, and each register 441 may provide a match signal Match, which is at the high level if all of the bits of the received address match the state of all of the bits of the stored address. In some embodiments, the match counter 460 may receive the match signal individually from the registers 441 and update the count CT2 if any of the match signals are at a high level. In some embodiments, the comparator circuit 444 may receive the match signals from each of the registers 441 and provide an overall match signal Match if any of the match signals from the registers 441 were at a high level.

If there is a match between the received address XADD and one of the stored addresses in the data storage unit 440, then the signal Match may be provided to the working counter circuit 446. The working counter circuit 446 may update the count value associated with the register 441 which contains the stored row address which matches the received row address XADD. When a match is indicated, the working counter circuit 446 may update the count value 442 in a first direction. For example, responsive to a match, the count value may be increased, such as being incremented (e.g., increased by 1).

In some embodiments, the working counter 446 may also update the access count value CT1 and the match count value CT2. In such an embodiment, rather than including counter circuits 460 and 462 in the dynamic refresh circuit 438, the count values CT1 and CT2 may be stored in registers (e.g., similar to the count values 442) and updated by the working count circuit 446 responsive to the access and match signals respectively. In some embodiments, the count values CT1 and CT2 may be stored in the data storage unit 440 (e.g., as count values 442 not associated with an address).

If there is not a match for any of the stored addresses in the data storage unit 440, the received row address XADD may be stored in the data storage unit 440. The comparator circuit 444 may determine if any of the registers 441 are available (e.g., not currently storing a row address). For example, in some embodiments, each of the registers 441 may include additional bits (e.g., additional memory cells) which are used to store an empty flag. The empty flag may be in a first state to indicate that the register is available (e.g., empty) and a second state to indicate that the register is not available (e.g., storing a row address), Other methods of determining if the registers 441 are available or not may be used in other examples.

If at least one of the registers 441 is available, the comparator circuit 444 may store the row address XADD in one of the available registers. If none of the registers are available, then the row address XADD may be stored in the register indicated by the minimum pointer 458. When the row address XADD is stored in the register 441, it may overwrite any previous row address stored in the register 441. When a new address is stored in one of the registers 441 (e.g., either overwriting an old address or being stored in an available register) the count value 442 associated with that register may be reset to an initial value (e.g., 0 or 1). For example, the comparator circuit 444 may send a reset signal (not shown) to the working counter circuit 446, which may update the indicated count value 442 to the initial value.

In the example embodiment of FIG. 4, an optional filter oscillator 448 is used to periodically update the count values 442 in a direction opposite the direction they are updated when there is a match. For example, if a count value 442 is increased when a received address XADD matches the address stored in the associated register 441, then all of the count values 442 may be decreased periodically. This may act as filter which may help to ensure that less frequently accessed rows do not accumulate high count values, while more frequently accessed rows do.

The filter oscillator circuit 448 may be an oscillator circuit which provides periodic activations of the oscillator signal FilterOsc. Each time the working counter circuit 446 receives an activation of the filter oscillator signal FilterOsc, the working counter circuit 446 may update all of the count values 442 in a second direction. For example, responsive to an activation of the oscillator signal FilterOsc, all of the count values 442 may be decreased, such as by decrementing them (e.g., decreasing by 1). In some embodiments, the count values 442 may have a minimum value (e.g., 0) and may not be decremented below the minimum value. For example, if a count value is at a minimum value of 0, and the filter oscillator circuit 448 provides an activation of the oscillator signal FilterOsc, the count value may remain at 0 instead of being further decremented.

In some embodiments, it may not be possible to simultaneously update a count value in both directions at the same time. To prevent this, in some optional embodiments, the oscillator signal FilterOsc may be provided to the sample timing circuit 430. When the oscillator signal FilterOsc is active, the sample timing circuit 430 may suppress any activations of the sampling signal ArmSample. Accordingly, the sample timing circuit 430 may be prevented from activating the signal ArmSample while the signal FilterOsc is active. The rate at which the filter oscillator 448 produces the signal FilterOsc (e.g., the period of the signal FilterOsc) may be based on rate at which the sample timing circuit 430 provides the signal ArmSample. In embodiments where the signal ArmSample has some degree of randomness, the period of the signal FilterOsc may be based on an average rate of the signal ArmSample.

A count comparator circuit 450 may compare the count values 442 to each other. The count comparator circuit 450 may determine a maximum value of the count values 442 and a minimum value of the count values 442. In some embodiments, the count comparator circuit 450 may determine the maximum and minimum each time one or more of the count values 442 is updated. In some embodiments, the count comparator circuit 450 may determine the maximum and minimum of the count values 442 when an address needs to be stored and/or retrieved from the data storage unit 440, In some embodiments other timing may be used to determine when the count comparator circuit 450 updates the pointers 456 and 458.

The count comparator circuit 450 may indicate the maximum and minimum values to a pointer logic circuit 454. The pointer logic circuit 454 may direct the maximum pointer 456 to indicate the register associated with the maximum count value and may direct the minimum pointer 458 to indicate the register associated with the minimum count value. The address stored in the register 441 indicated by the maximum pointer 456 may be provided as the match address HitXADD. The address stored in the register 441 indicated by the minimum pointer 458 may be replaced by a new address when there are no available registers.

In some embodiments, an optional sequential scrambler 452 may be coupled between the count comparator circuit 450 and the pointer logic circuit 454. The sequential scrambler 452 may occasionally replace the register identified as the maximum by the count comparator circuit 450 with a register from a sequence of registers. Accordingly, the pointer logic circuit 454 may be directed to indicate a register 441 from the sequence of registers instead of the register 441 associated with the maximum count value 442. For example, the sequential scrambler 452 may activate every other time the location of the pointers 456 and 458 are updated. Accordingly, the maximum pointer 456 may indicate a register associated with a maximum count value, a first register in the sequence, a register associated with a maximum count value, a second register in the sequence, etc.

Figure 5:
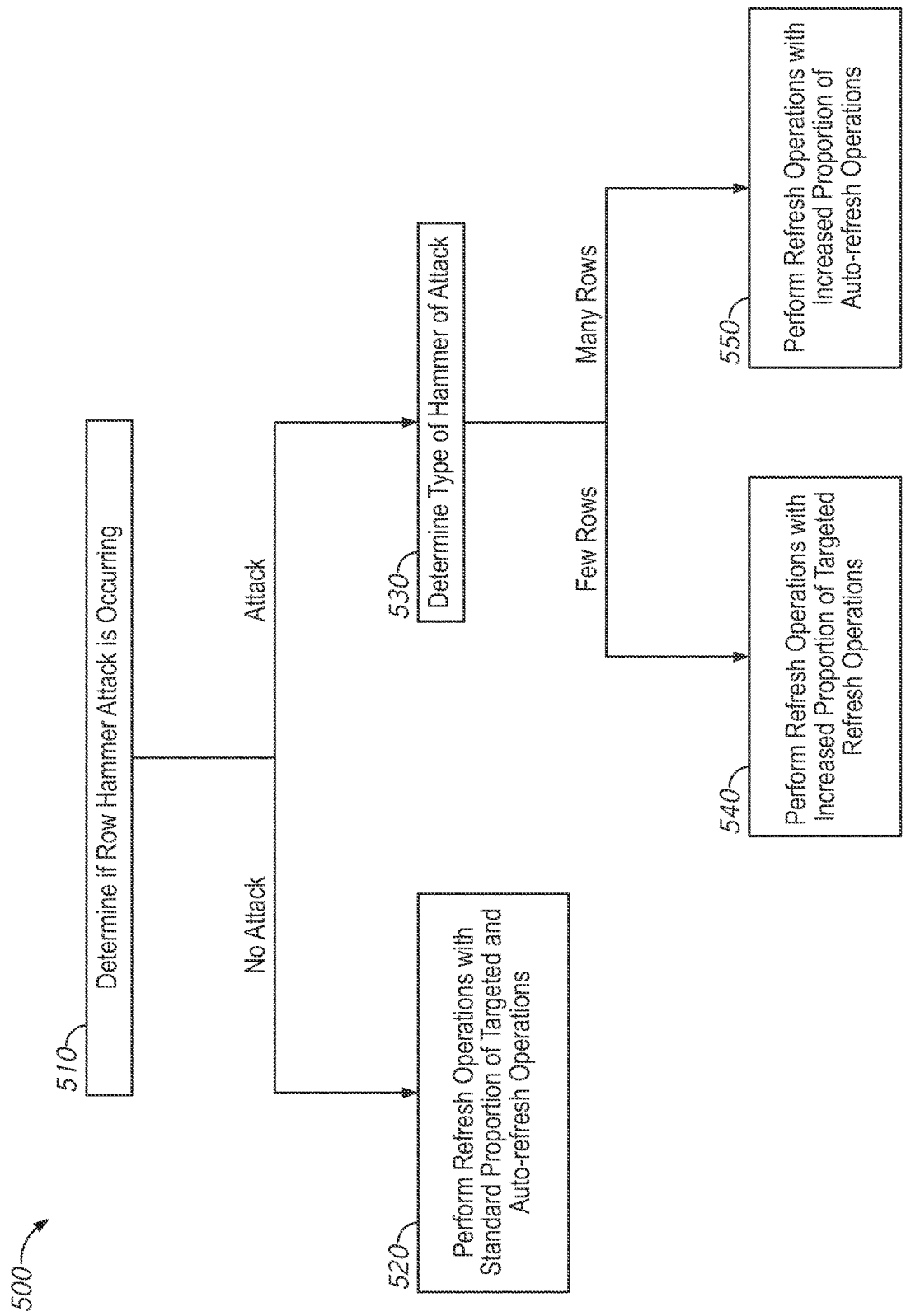
FIG. 5 is a flow chart of a method of dynamically allocating refresh operations according to an embodiment of the present disclosure.

FIG. 5 is a flow chart of a method of dynamically allocating refresh operations according to an embodiment of the present disclosure. The method 500 may be implemented by one or more of the devices and/or components discussed in FIGS. 1-4.

The method 500 may generally begin with block 510, which describes determining if a row hammer attack is occurring. Whether or not a hammer attack is occurring may be determined by measuring a rate of access commands. For example, an access counter may count a number sampled row addresses. If the count is above a threshold, it may indicate that the memory is likely under some kind of hammer attack. If the count is not above the threshold, it may indicate that the memory is not being subjected to an attack. The block 510 may be performed each time an access operation occurs. For example, the access count value may be compared to the threshold each time the count is updated. The access count value may be reset when one or more conditions (such as a targeted refresh operation being performed) occurs.

If it is determined that a row attack is not occurring (e.g., if the access count is not above the threshold), then block 510 may generally be followed by block 520, which describes performing refresh operations with a standard proportion of targeted and auto-refresh operations. Responsive to block 520, the next time a set of refresh operations is performed (e.g., responsive to the refresh signal AREF), there may be a certain number of targeted and auto-refresh operations in the set. The allocation of targeted and auto-refresh operations may be based on a standard allocation between the types of refresh operation.

If it is determined that a row attack is occurring (e.g., if the access count is above the threshold), then block 510 may generally be followed by block 530, which describes determining a type of the hammer attack. Block 530 may involve determining how many different rows are involved in the hammer attack. For example, a match counter may be used to count a number of times that a sampled row address matches a stored address. If the match counter is above a threshold, then relatively few rows may be used in the hammer attack. If the match counter is below the threshold, then relatively many rows may be involved in the hammer attack.

If relatively few rows are involved in the hammer attack (e.g., if the match count is above the threshold) then block 530 may generally be followed by block 540. Block 540 describes performing refresh operations with an increased proportion of targeted refresh operations. The set of refresh operations described in block 540 may have a higher proportion of targeted refresh operations than the set of refresh operations described in block 520.

If relatively many rows are involved in the hammer attack (e.g., if the match count is not above the threshold), then block 530 may generally be followed by block 550. Block 550 describes performing refresh operations with an increased proportion of auto-refresh operations. The set of refresh operations described in block 550 may have a higher proportion of auto-refresh operations than the set of refresh operations described in block 520.

Of course, it is to be appreciated that any one of the examples, embodiments or processes described herein may be combined with one or more other examples, embodiments and/or processes or be separated and/or performed amongst separate devices or device portions in accordance with the present systems, devices and methods.

Finally, the above-discussion is intended to be merely illustrative of the present system and should not be construed as limiting the appended claims to any particular embodiment or group of embodiments. Thus, while the present system has been described in particular detail with reference to exemplary embodiments, it should also be appreciated that numerous modifications and alternative embodiments may be devised by those having ordinary skill in the art without departing from the broader and intended spirit and scope of the present system as set forth in the claims that follow. Accordingly, the specification and drawings are to be regarded in an illustrative manner and are not intended to limit the scope of the appended claims.

What is claimed is:

1. A method comprising:
    determining if a row hammer attack is occurring;
    determining a type of the row hammer attack based a number row addresses involved in the row hammer attack if the row hammer attack is determined to be occurring;
    changing a proportion of targeted refresh operations and auto-refresh operations based on the determined type of the row hammer attack.

2. The method of claim 1, further comprising determining if the row hammer attack is occurring based on a rate of access operations.

3. The method of claim 1, further comprising determining the type of the row hammer attack based on a number of row addresses involved in the row hammer attack.

4. The method of claim 1, further comprising:
    increasing the proportion of targeted refresh operations to auto-refresh operations if the number of row addresses involved in the row hammer attack is greater than a threshold; and
    increasing the proportion of auto-refresh operations to targeted refresh operations if the number of row addresses involved in the row hammer attack is less than a threshold.

5. The method of claim 1, further comprising:
    counting a number of times that a row address is received; and
    determining if the row hammer attack is occurring based on the count.

6. The method of claim 1, further comprising:
    storing a plurality of stored row addresses;
    counting a number of times a received row address matches one of the plurality of stored row addresses; and
    determining the type of the row hammer attack based on the count of the number of times the received row address matched.

7. The method of claim 1, further comprising:
    refreshing a first number of word lines as part of the targeted refresh operation; and
    refreshing a second number of number of word lines as part of the auto-refresh operation, wherein the first number is different than the second number.

8. The method of claim 1, further comprising identifying an address is an aggressor address and refreshing an address based on the aggressor address as part of the targeted refresh operation.

9. An apparatus comprising:
    a memory array comprising a plurality of wordlines;
    a row decoder configured to perform a set of refresh operations on the memory array, wherein the set of refresh operations comprise a first type of refresh operation and a second type of refresh operation; and
    a refresh control circuit configured to determine if a row hammer attack is occurring, and configured to dynamically determine how many of the refresh operations in the set are the first type of refresh operation and how many are the second type of refresh operation based, in part, on if the row hammer attack is occurring.

10. The apparatus of claim 9, wherein the refresh control circuit is further configured to determine a type of the row hammer attack if the row hammer attack is occurring, and wherein how many of the refresh operations in the set are the first type of refresh operation and how many are the second type of refresh operation is based, in party, on the type of the row hammer attack.

11. The apparatus of claim 10, wherein the refresh control circuit is configured to store a plurality of row addresses, and wherein the type of row hammer attack is determined based on a comparison between a received row address and the plurality of stored row addresses.

12. The apparatus of claim 9, wherein the refresh control circuit is configured to determine if the row hammer attack is occurring based on a rate of access operations.

13. The apparatus of claim 9, wherein the refresh control circuit is configured to determine a type of the row hammer attack based on a number of row address involved in the row attack.

14. The apparatus of claim 9. wherein the first type of refresh operation is a targeted refresh operation and the second type of refresh operation is an auto-refresh operation.

15. An apparatus comprising:
a memory array comprising a plurality of wordlines; and
a refresh control circuit configured to provide a set of refresh addresses responsive to a refresh signal, wherein the refresh control circuit is configured to determine a proportion of the set of refresh addresses which are a first type of refresh address and which are a second type of refresh address based on if a row hammer attack is occurring.

16. The apparatus of claim 15, wherein the refresh control circuit is further configured to determine a type of the row hammer attack if the row hammer attack is occurring, based on a number of rows involved in the row hammer attack.

17. The apparatus of claim 16, wherein if the number of rows is greater than a threshold, the refresh control circuit is configured to increase a proportion of the second type of refresh address, and wherein if a number of rows is below the threshold, the refresh control circuit is configured to increase a proportion of the first type of refresh address.

18. The apparatus of claim 15, wherein the first type of refresh address is a targeted refresh address, and wherein the second type of refresh address is an auto-refresh address.

19. The apparatus of claim 15, wherein the refresh control circuit is configured to determine if the row hammer attack is occurring based on a rate of access operations to the memory array.

20. The apparatus of claim 15, further comprising a row decoder configured to refresh selected ones of the plurality of word lines associated with each of the set of refresh addresses.

* * * * *